(12) United States Patent
Keun et al.

(10) Patent No.: US 9,777,108 B2
(45) Date of Patent: Oct. 3, 2017

(54) COPOLYMER AND ORGANIC SOLAR CELL COMPRISING SAME

(71) Applicant: LG CHEM, LTD., Seoul (KR)

(72) Inventors: Cho Keun, Daejeon (KR); Bae Jaesoon, Daejeon (KR); Lee Jaechol, Daejeon (KR); Lee Jiyoung, Daejeon (KR); Lee Hangken, Daejeon (KR); Kim Jinseck, Daejeon (KR); Lim Bogyu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/022,121

(22) PCT Filed: Sep. 16, 2014

(86) PCT No.: PCT/KR2014/008611
§ 371 (c)(1),
(2) Date: Mar. 15, 2016

(87) PCT Pub. No.: WO2015/037966
PCT Pub. Date: Mar. 19, 2015

(65) Prior Publication Data
US 2016/0237204 A1 Aug. 18, 2016

(30) Foreign Application Priority Data
Sep. 16, 2013 (KR) .................. 10-2013-0111394

(51) Int. Cl.
C08G 75/00 (2006.01)
C08G 61/12 (2006.01)
(Continued)

(52) U.S. Cl.
CPC ......... *C08G 61/126* (2013.01); *C08G 61/123* (2013.01); *C08G 73/06* (2013.01); *C08L 65/00* (2013.01); *H01L 51/0035* (2013.01); *H01L 51/0036* (2013.01); *H01L 51/0043* (2013.01); *H01L 51/424* (2013.01); *H01L 51/4253* (2013.01); *C08G 2261/12* (2013.01); *C08G 2261/122* (2013.01); *C08G 2261/149* (2013.01);
(Continued)

(58) Field of Classification Search
CPC ................ C08G 75/32; C08G 2261/91; H01L 51/0047; Y02E 10/549
See application file for complete search history.

(56) References Cited

U.S. PATENT DOCUMENTS

2009/0065766 A1  3/2009  Li
2012/0071617 A1  3/2012  Dueggeli et al.
(Continued)

FOREIGN PATENT DOCUMENTS

CN  102060982 A  5/2011
CN  103130988 A  6/2013
(Continued)

OTHER PUBLICATIONS

Jiang et al. Polym. Chem., 2013, 4, 5321-5328.*
(Continued)

*Primary Examiner* — Shane Fang
(74) *Attorney, Agent, or Firm* — Dentons US LLP

(57) ABSTRACT

The present specification provides a copolymer and an organic solar cell including the same.

17 Claims, 18 Drawing Sheets

(51) Int. Cl.
  *C08G 73/06* (2006.01)
  *C08L 65/00* (2006.01)
  *H01L 51/00* (2006.01)
  *H01L 51/42* (2006.01)
(52) U.S. Cl.
  CPC ............ C08G 2261/1412 (2013.01); C08G 2261/1424 (2013.01); C08G 2261/3223 (2013.01); C08G 2261/3229 (2013.01); C08G 2261/3241 (2013.01); C08G 2261/3243 (2013.01); C08G 2261/334 (2013.01); C08G 2261/344 (2013.01); C08G 2261/364 (2013.01); C08G 2261/414 (2013.01); C08G 2261/514 (2013.01); C08G 2261/91 (2013.01); Y02E 10/549 (2013.01)

(56) References Cited

U.S. PATENT DOCUMENTS

| | | |
|---|---|---|
| 2012/0095236 A1 | 4/2012 | Hayoz et al. |
| 2012/0186652 A1 | 7/2012 | Pan et al. |
| 2013/0056072 A1 | 3/2013 | Park et al. |
| 2013/0056073 A1 | 3/2013 | Kim et al. |
| 2013/0137842 A1* | 5/2013 | Lee ............... C07D 417/14 526/239 |
| 2013/0167929 A1 | 7/2013 | Wen et al. |
| 2013/0187134 A1 | 7/2013 | Chung et al. |
| 2014/0233304 A1 | 8/2014 | Nebashi et al. |
| 2014/0243492 A1* | 8/2014 | Fujita ............... C07F 7/30 526/240 |
| 2014/0290747 A1 | 10/2014 | Kim et al. |

FOREIGN PATENT DOCUMENTS

| | | |
|---|---|---|
| EP | 2774931 A1 | 9/2014 |
| EP | 2774940 A1 | 9/2014 |
| JP | 2012-528215 A | 11/2012 |
| KR | 2012-0022879 A | 3/2012 |
| KR | 2013-0016132 A | 9/2012 |
| KR | 10-2013-0016130 A | 2/2013 |
| KR | 10-2013-0090821 A | 8/2013 |
| TW | 200922963 A | 6/2009 |
| TW | 201114800 A1 | 5/2011 |
| WO | 2010/136535 A1 | 12/2010 |
| WO | 2012/135527 A2 | 10/2012 |
| WO | 2013/035836 A1 | 3/2013 |
| WO | 2013/065836 A1 | 5/2013 |
| WO | 2013/065855 A1 | 5/2013 |
| WO | 2013-065855 A1 | 5/2013 |

OTHER PUBLICATIONS

Carsten et al. (Macromolecules 2012, 45, 6390-6395).*
Zhou, et al.: "Introduction of a conjugated side chain as an effective approach to improving donor-acceptor photovoltaic polymers", Energy & Environmental Science, vol. 5, 2012, pp. 9756-9759.
Yuan, et al.: "Synthesis and Characterization of Pyrido[3,4-b]pyrazine-Based Low-Bandgap Copolymers for Bulk Heterojunction Solar Cells", Macromolecules, vol. 43, No. 15, Jul. 12, 2010, pp. 6270-6277.
Kang, et al.: "Importance of Optimal Composition in Random Terpolymer-Based Polymer Solar Cells", Macromolecules, vol. 46, No. 17, Aug. 22, 2013, pp. 6806-6813.
Zhang, et al.: "Synthesis and characterization of thieno[3,4-c]pyrrole-4,6-dione and pyrrolo[3,4-c]pyrrole-1,4-dione-ased random polymers for photovoltaic application", Polymer, vol. 53, Aug. 10, 2012, pp. 4407-4412.
Hou, et al: "Benzo[1,2-b:4,5-b']dithiophene-based conjugated polymers: band gap and energy level control and their application in polymer solar cells", Polymer Chemistry, vol. 2, Aug. 10, 2011, pp. 2453-2461.
Patra, et al.: "Synthesis and Applications of 2,7-Carbazole-Based Conjugated Main-Chain Copolymers Containing Electron Deficient Bithiazole Units for Organic Solar Cells", XP-055358365, Journal of Polymer Science: Part A: Polymer Chemistry, vol. 48, No. 23, Dec. 2010, pp. 5479-5489.
Bao, et al.: "Conjugated polymers containing a 2,2'-biimidazole moiety-a novel fluorescent sensing platform", XP-055358368, Chemical Communications, vol. 48, No. 1, Jan. 2012, pp. 118-120.
Bao, et al.: "2,2'-Biimidazole-Based Conjugated Polymers as a Novel Fluorescent Sensing Platform for Pyrophosphate Anion", XP-055358371, Macromolecules, vol. 45, No. 8, Apr. 24, 2012, pp. 3394-3401.
Vetrichelvan, et al.: "Carbazole-Containing Conjugated Copolymers as ColorimetricfFluorimetric Sensor for Iodide Anion", XP-055358378, Macromolecules, vol. 39, No. 24, Nov. 2006, pp. 8303-8310.
Bronstein, et al.: "Thieno[3,2-b]thiophene-diketopyrrolopyrrole Containing Polymers for Inverted Solar Cells Devices with High Short Circuit Currents", XP-001588542, Advanced Functional Materials, vol. 23, No. 45, Jun. 17, 2013, pp. 5647-5654.
Hu, et al.: "New -(D-A1-D-A2)n- type conjugated polymers for photovoltaic applications: consensus between low band-gap and low HOMO energy level", XP-029002873, Tetrahedron, Elsevier Science Publishers, vol. 69, No. 16, Feb. 26, 2013, pp. 3419-3424.

* cited by examiner

[Figure 1]
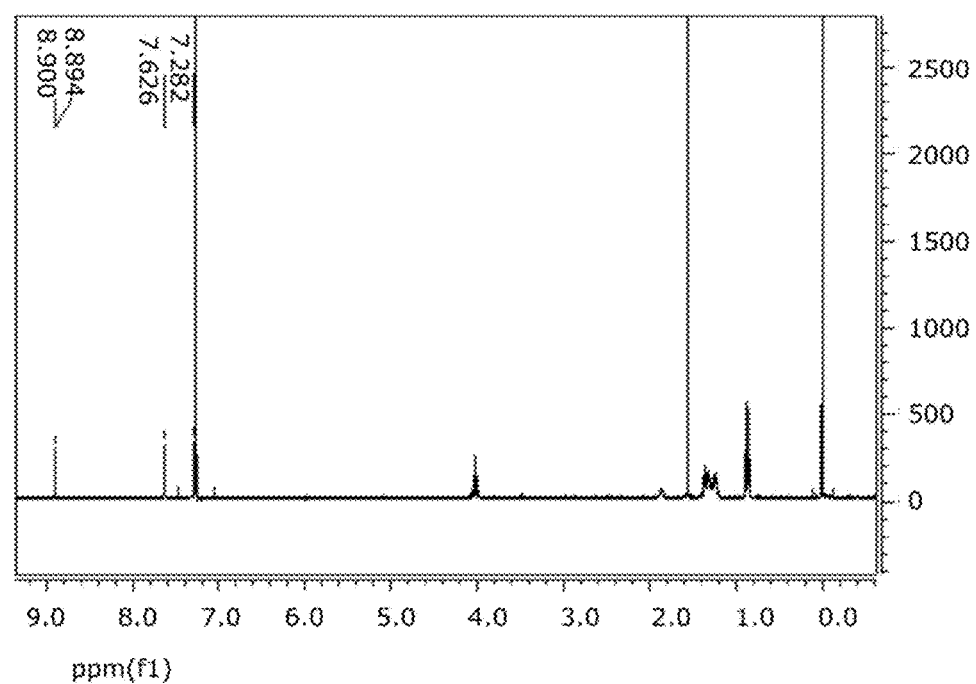

[Figure 2]
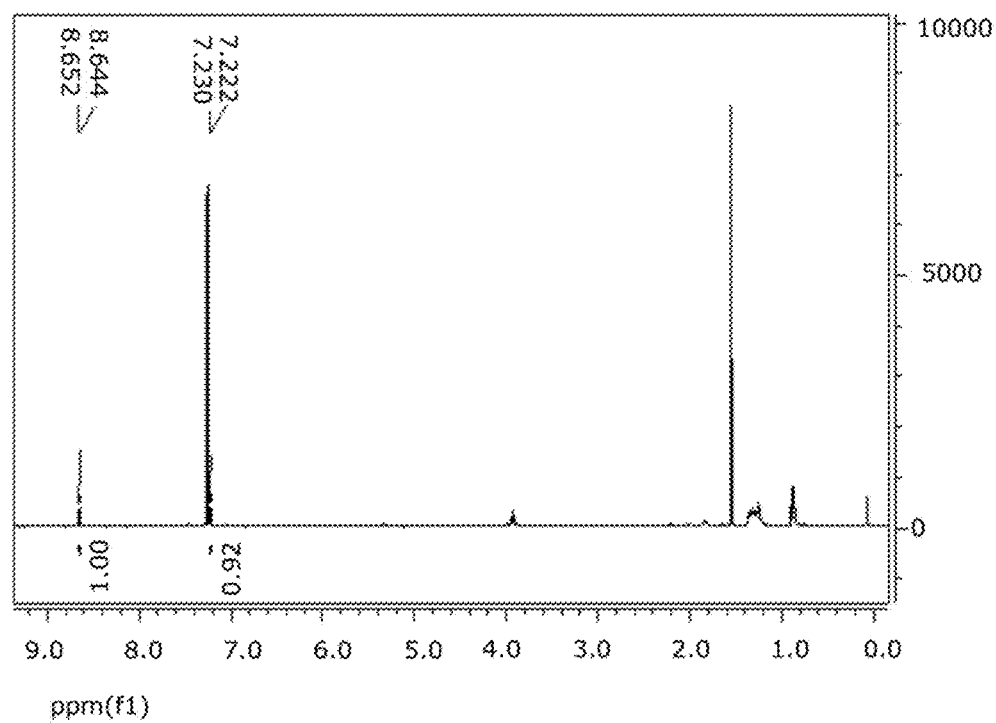

[Figure 3]
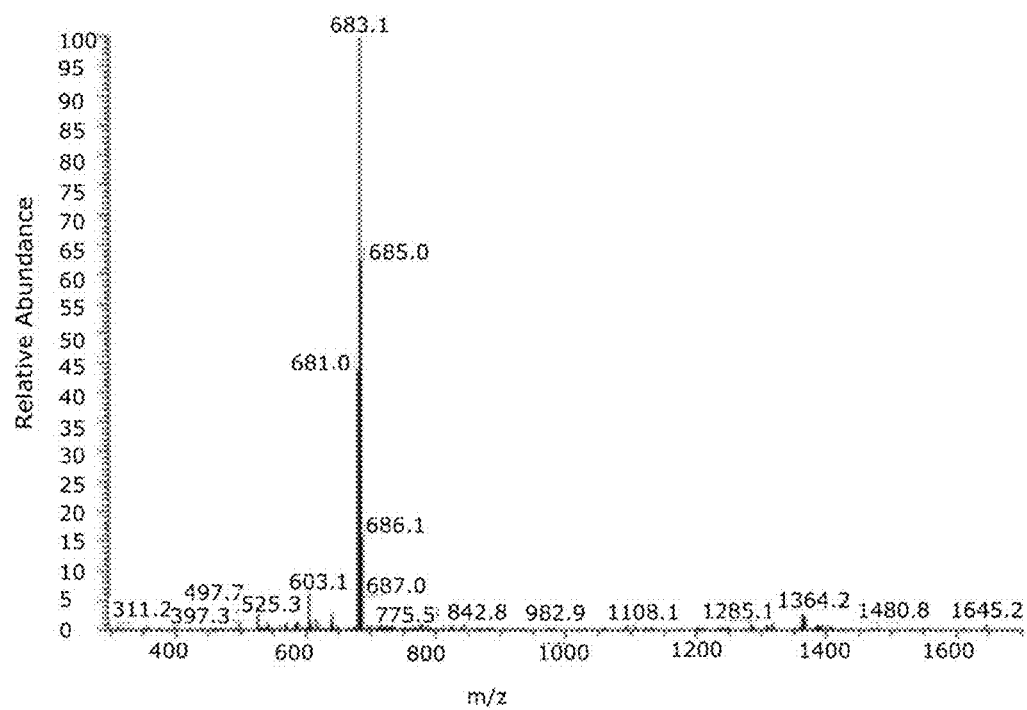

[Figure 4]
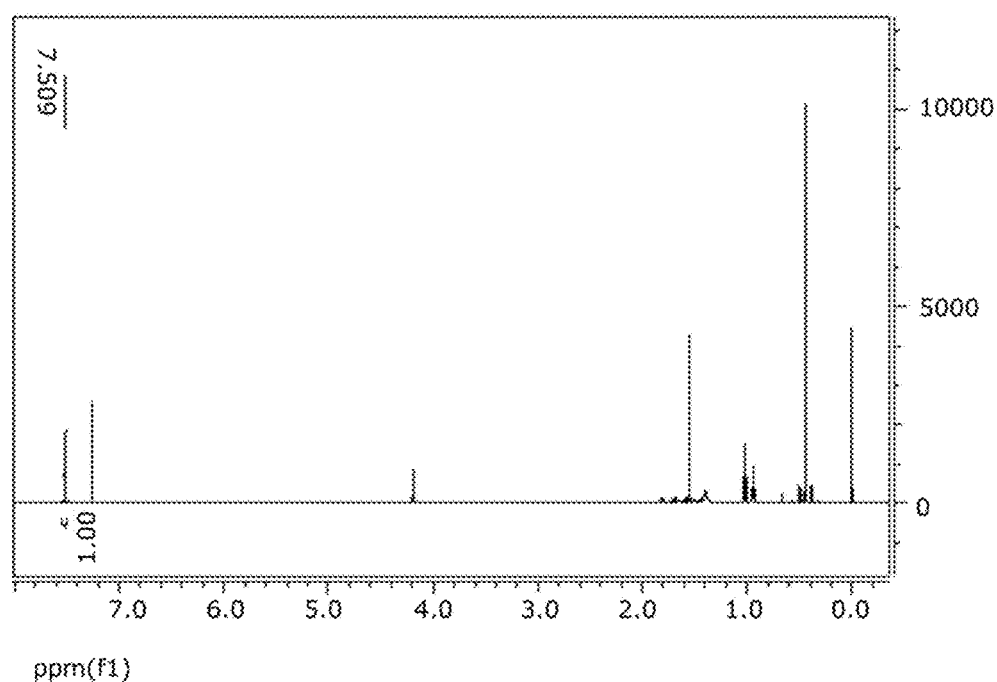

[Figure 5]
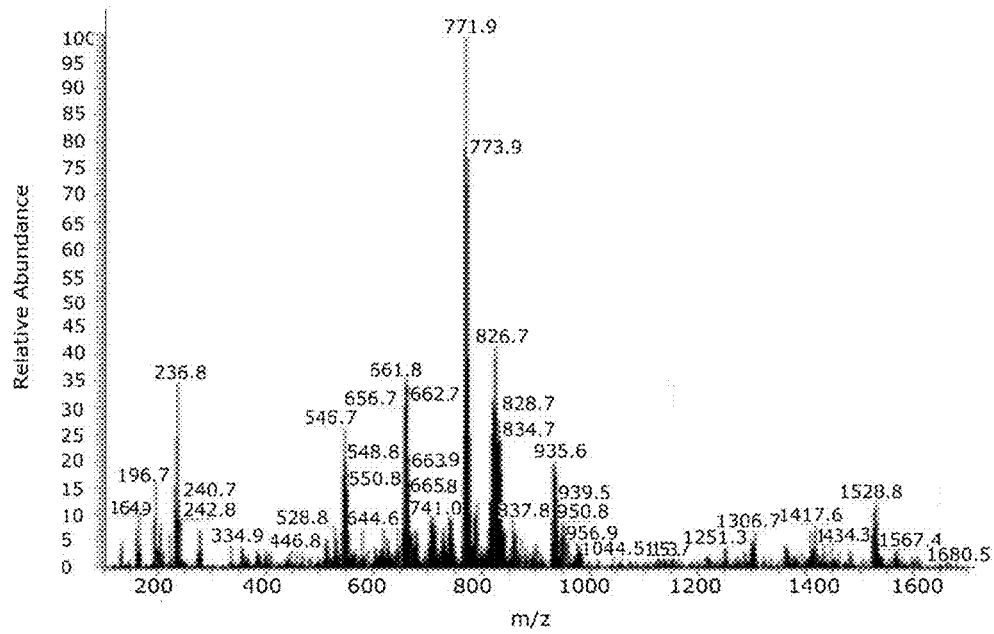

[Figure 6]
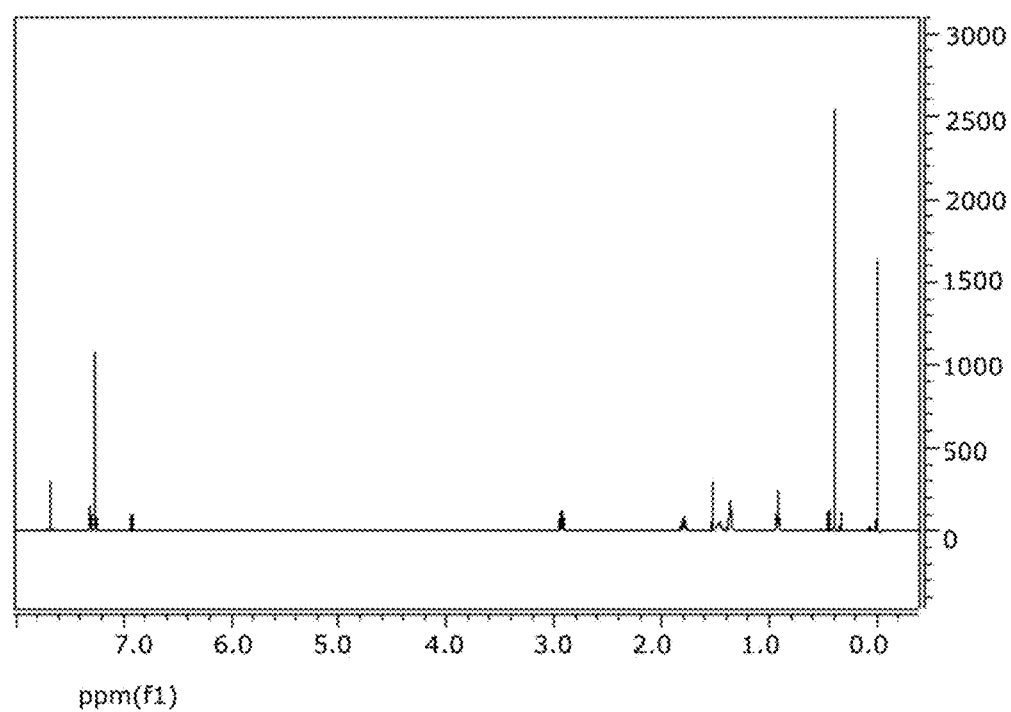

[Figure 7]
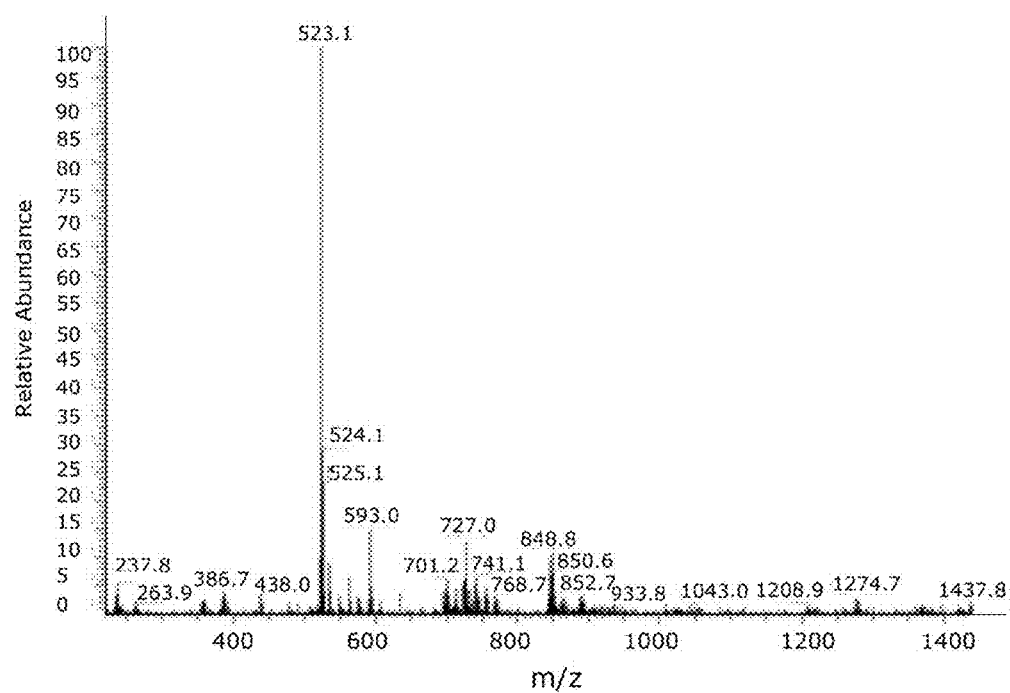

[Figure 8]
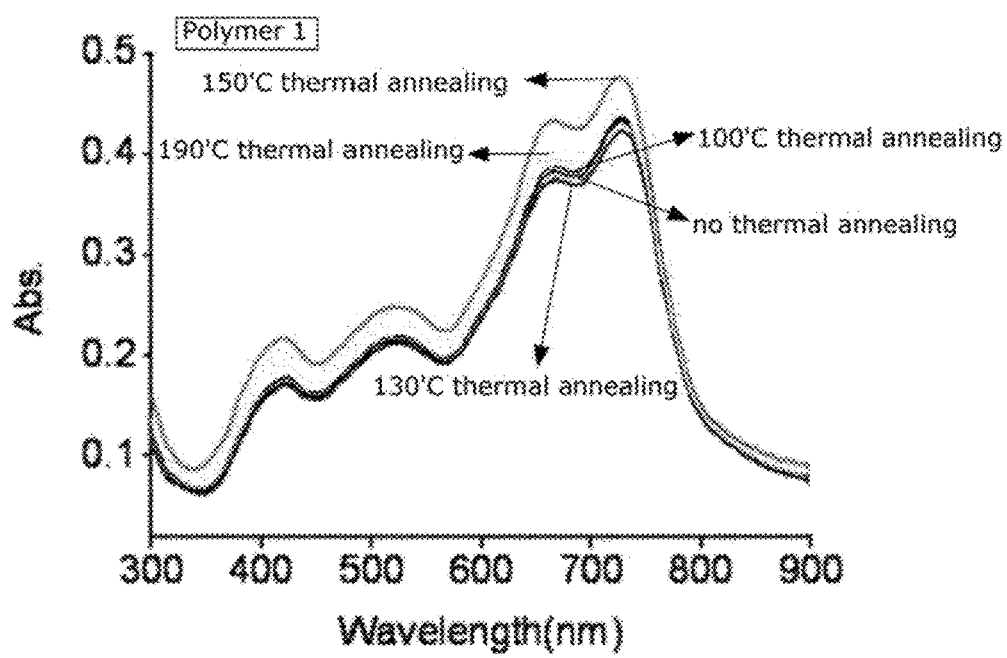

[Figure 9]
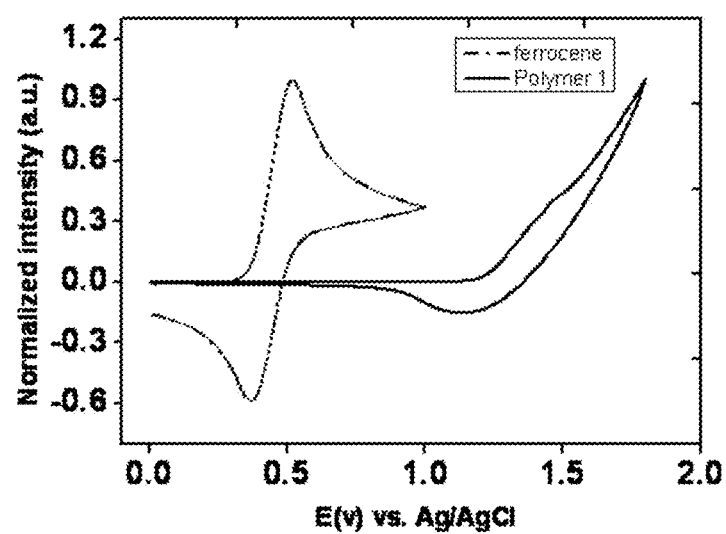

[Figure 10]
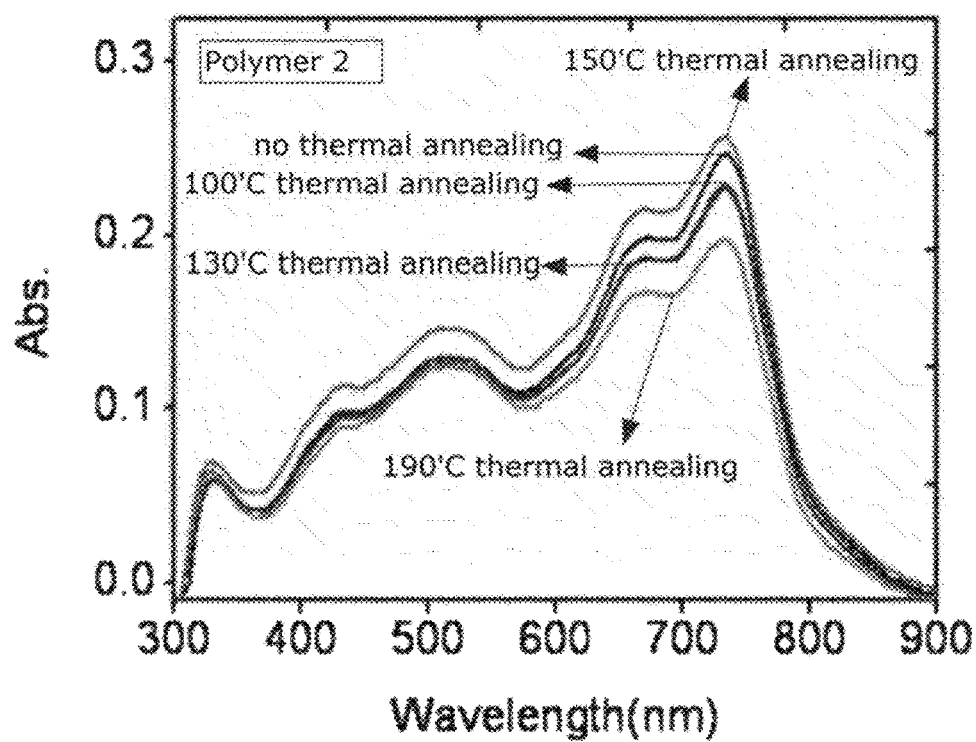

[Figure 11]
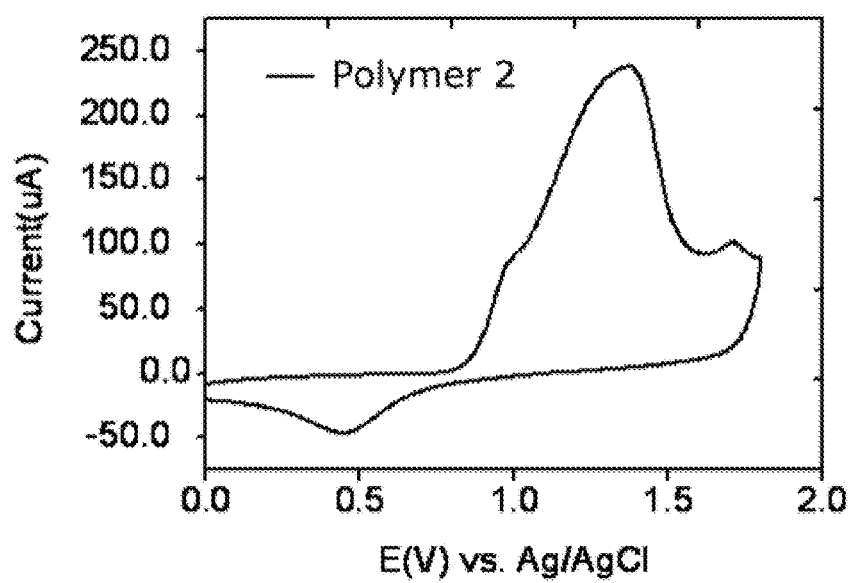

[Figure 12]
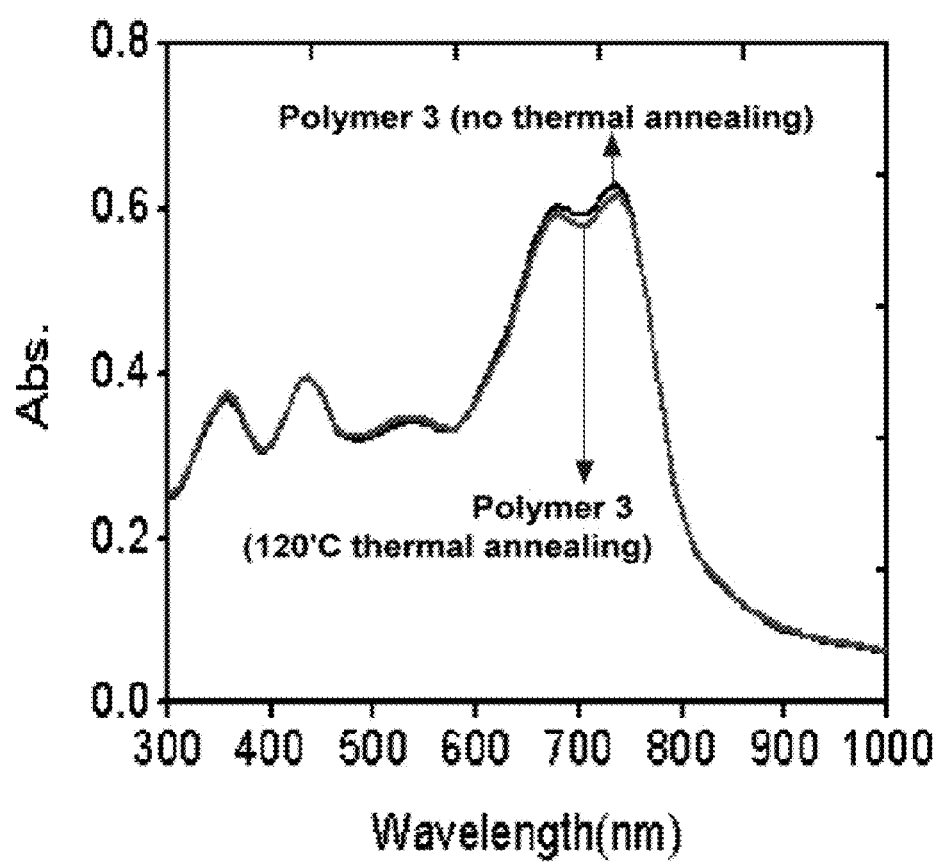

[Figure 13]
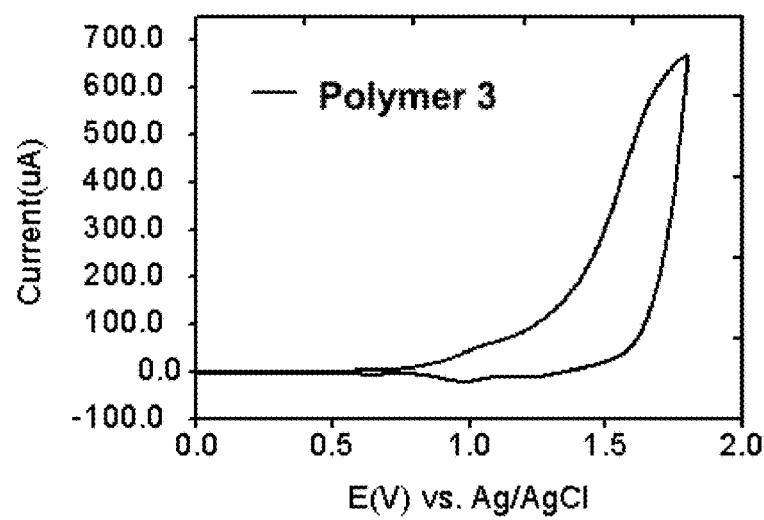

[Figure 14]
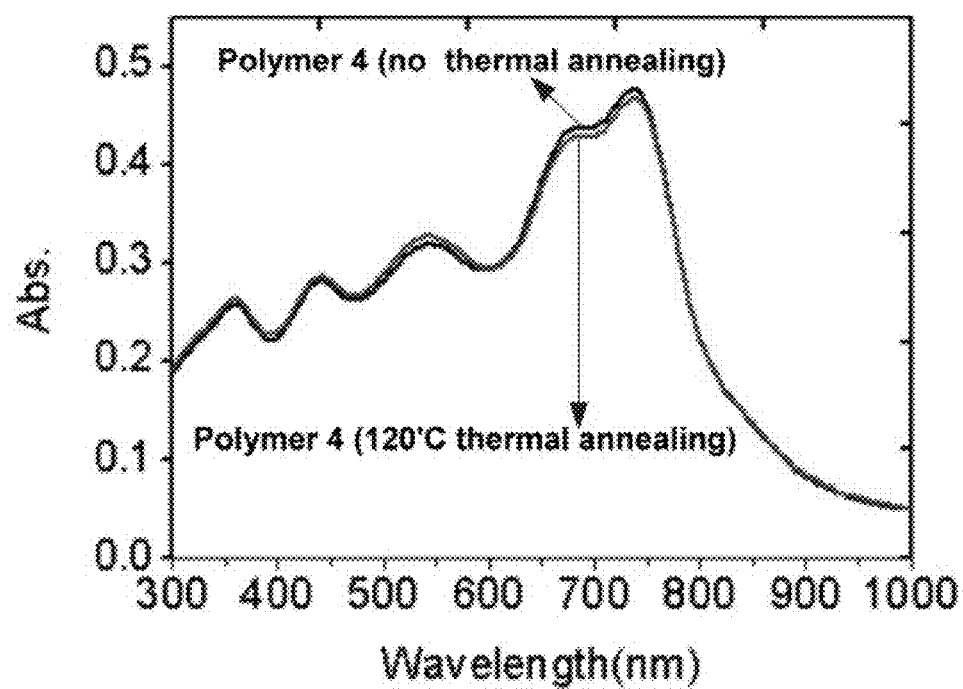

[Figure 15]
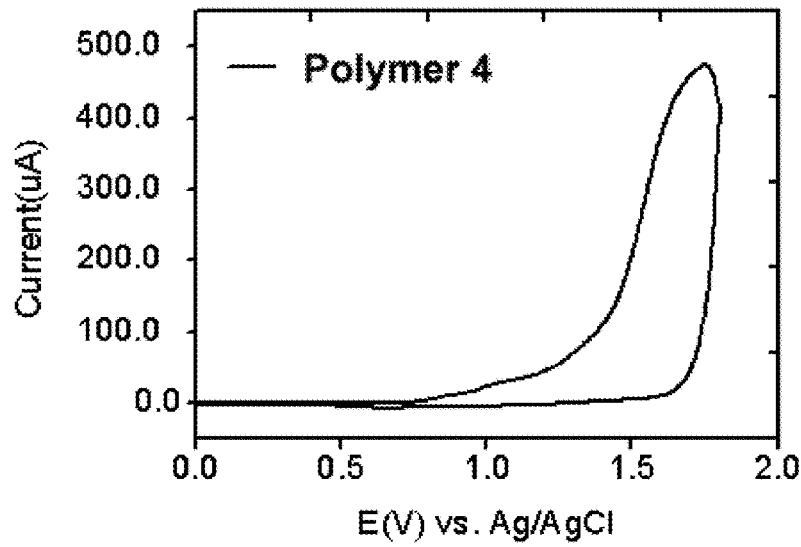
[Figure 16]
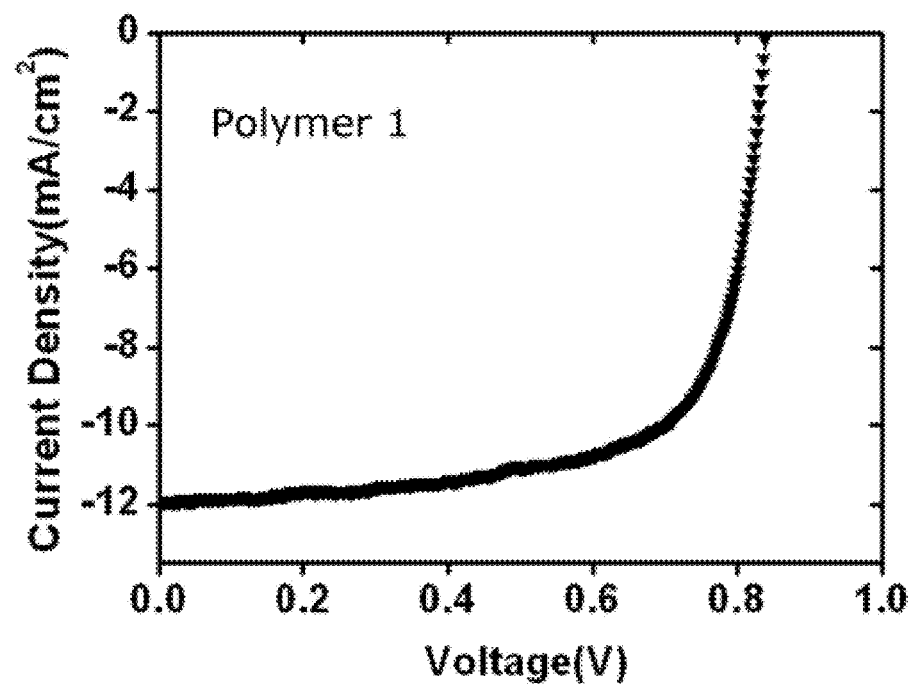

[Figure 17]
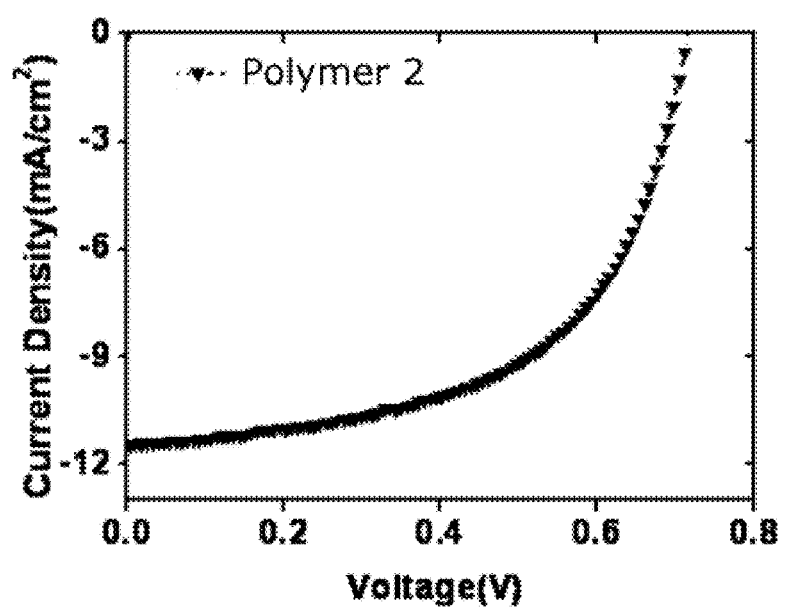

[Figure 18]
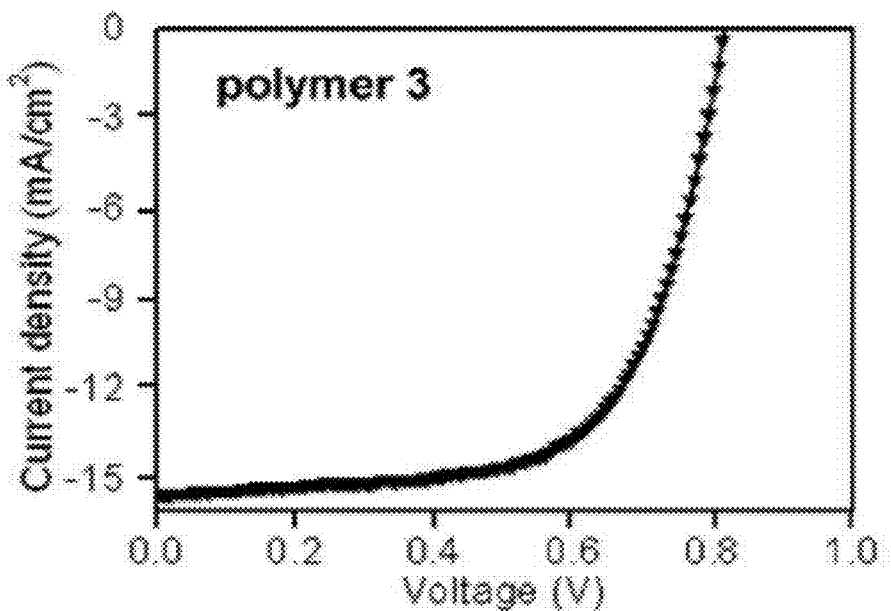
[Figure 19]
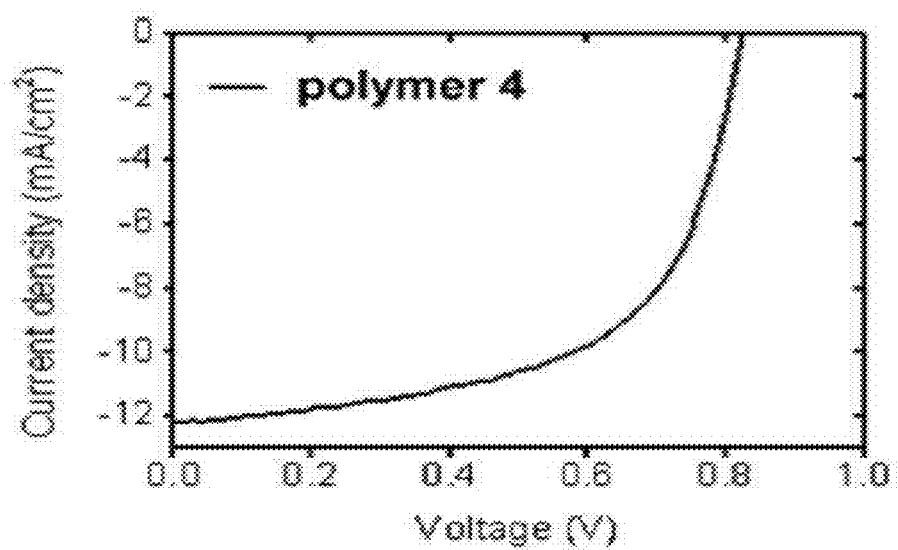

[Figure 20]
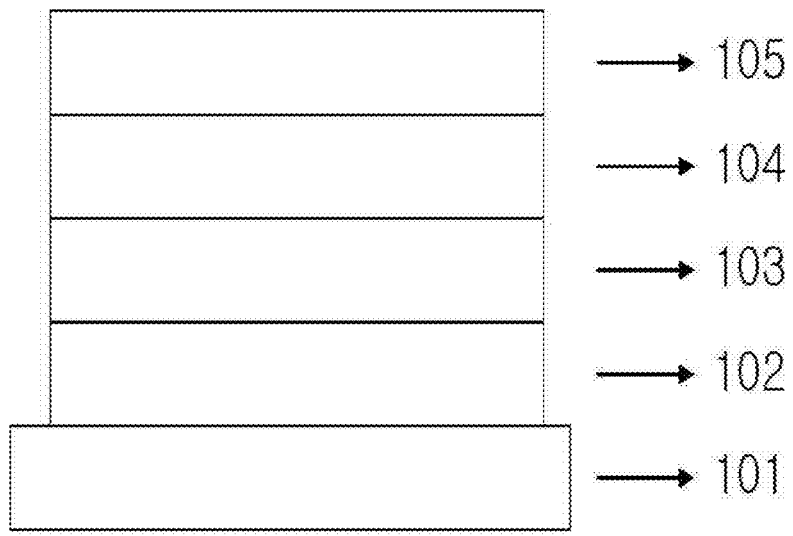

COPOLYMER AND ORGANIC SOLAR CELL COMPRISING SAME

CROSS-REFERENCE TO RELATED APPLICATION(S)

This application is a National Stage Application of International Application No. PCT/KR2014/008611, filed Sep. 16, 2014, and claims the benefit of Korean Patent Application No. 10-2013-0111394 filed Sep. 16, 2013, the contents of which are incorporated by reference in their entirety for all purposes as if fully set forth below.

TECHNICAL FIELD

This application claims priority to and the benefit of Korean Patent Application No. 10-2013-0111394 filed in the Korean Intellectual Property Office on Sep. 16, 2013, the entire contents of which are incorporated herein by reference.

The present specification relates to a copolymer and an organic solar cell including the same.

BACKGROUND ART

An organic solar cell is a device that can directly convert solar energy into electric energy by applying a photoelectromotive effect. The solar cell may be divided into an inorganic solar cell and an organic solar cell according to a material constituting a thin film. A typical solar cell is manufactured by doping crystalline silicon (Si) that is an inorganic semiconductor to perform p-n conjunction. Electrons and holes generated by absorbing light are diffused to a p-n conjunction point, and are accelerated by an electric field thereof to move to an electrode. Electric power conversion efficiency of this process is defined by a ratio of electric power provided to an external circuit and solar power provided to the solar cell, and recently, has attained to about 24% when measured under a standardized virtual solar radiation condition. However, since an existing inorganic solar cell already has limitations in view of economic feasibility and supply and demand on materials, an organic semiconductor solar cell that is easily processed, at low cost, and includes various functionalities has come into the limelight as a long-term alternative energy source.

In the solar cell, it is important to increase efficiency so as to outadded as much electric energy as possible from solar energy. In order to increase efficiency of the solar cell, it is important to generate as many excitons as possible in a semiconductor, and also important to draw generated electric charges to the outside without a loss. One of the factors of the electric charge loss is extinction caused by recombination of the generated electrons and holes. Various methods have been proposed as a method for transporting the generated electrons or holes to an electrode without a loss, but most methods require an additional process, and thus manufacturing cost may be increased.

PRIOR ART DOCUMENT

Patent Document (Patent Document 1) U.S. Pat. No. 5,331,183
(Patent Document 2) U.S. Pat. No. 5,454,880

Non-Patent Document (Non-Patent Document 1) Two-Layer Organic Photovoltaic Cell (C. W. Tang, Appl. Phys. Lett., 48, 183. (1996))

(Non-Patent Document 2) Efficiencies via Network of Internal Donor-Acceptor Heterojunctions (G. Yu, J. Gao, J. C. Hummelen, F. Wudl, A. J. Heeger, Science, 270, 1789. (1995))

DETAILED DESCRIPTION OF THE INVENTION

Technical Problem

The present specification has been made in an effort to provide a copolymer and an organic solar cell including the same.

Technical Solution

An exemplary embodiment of the present specification provides a copolymer including a unit represented by the following Chemical Formula 1 or 2.

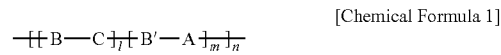

[Chemical Formula 1]

[Chemical Formula 2]

In Chemical Formulas 1 and 2, l is a mol fraction and a real number of more than 0 and less than 1, m is a mol fraction and a real number of more than 0 and less than 1, a sum of l and m is 1, n is an integer of 1 to 10,000, A is unit A including a substituted or unsubstituted 5-membered or 6-membered monocyclic nitrogen-containing hetero-cyclic group, B and B' are the same as or different from each other, and are each independently unit B including a substituted or unsubstituted monocyclic or polycyclic hetero-cyclic group, C is unit C including a substituted or unsubstituted monocyclic or polycyclic aryl group or a substituted or unsubstituted monocyclic or polycyclic hetero-cyclic group, and at least one of unit B and unit C includes a substituted or unsubstituted polycyclic aryl group or a substituted or unsubstituted polycyclic hetero-cyclic group.

Another exemplary embodiment of the present specification provides an organic solar cell including: a first electrode; a second electrode provided to face the first electrode; and one or more organic material layers provided between the first electrode and the second electrode and including a photoactive layer, in which one or more layers of the organic material layers include the copolymer.

Advantageous Effects

A copolymer according to an exemplary embodiment of the present specification has a large molecular weight and thus is economical in terms of time and/or costs in manufacturing an organic solar cell.

Further, even though a device including the copolymer having the large molecular weight has a structure other than a tandem structure, it is possible to provide the device that has sufficient efficiency using only one unit cell as compared to a device including a copolymer having a relatively small molecular weight.

Further, in the case where the device has the tandem structure, the device including the copolymer according to the exemplary embodiment of the present specification can provide a device having higher efficiency as compared to the copolymer having the relatively small molecular weight.

The copolymer of the present specification can be used as a material of an organic material layer of the organic solar cell, and the organic solar cell using the same can have excellent properties in terms of an increase in open circuit voltage and efficiency. Particularly, the copolymer according to the exemplary embodiment of the present specification can have a deep HOMO level, a small band gap, and high charge mobility and thus have excellent properties. The copolymer according to the exemplary embodiment of the present specification can be used alone or used while being mixed with other materials in the organic solar cell, and can improve efficiency and a life-span property of the device when thermal stability of a compound is maintained.

BRIEF DESCRIPTION OF DRAWINGS

FIG. 1 is a view illustrating an NMR spectrum of 2,5-diethylhexyl-3,6-dithiophene-2-ylpyrrolo[3,4-c]pyrrole-1,4-dione of Example 1.

FIG. 2 is a view illustrating an NMR spectrum of 3,6-bis(5-bromo-2-thienyl)-2,5-bis(2-ethylhexyl)-2,5-dihydropyrrolo[3,4-c]pyrrole-1,4-dione of Example 1.

FIG. 3 is a view illustrating an MS spectrum of 3,6-bis(5-bromo-2-thienyl)-2,5-bis(2-ethylhexyl)-2,5-dihydropyrrolo[3,4-c]pyrrole-1,4-dione of Example 1.

FIG. 4 is a view illustrating an NMR spectrum of a compound of Example 2.

FIG. 5 is a view illustrating an MS spectrum of the compound of Example 2.

FIG. 6 illustrates an NMR spectrum of a compound of Example 3.

FIG. 7 illustrates an MS spectrum of the compound of Example 3.

FIG. 8 is a view illustrating a film-type UV-Vis light absorption spectrum obtained by heat treatment of a chlorobenzene solution of copolymer 1 of Example 5.

FIG. 9 is a view illustrating an electrochemical measurement result (cyclic voltammetry) of copolymer 1 of Example 5.

FIG. 10 is a view illustrating a film-type UV-Vis light absorption spectrum obtained by heat treatment of a chlorobenzene solution of copolymer 2 of Example 5.

FIG. 11 is a view illustrating an electrochemical measurement result (cyclic voltammetry) of copolymer 2 of Example 6.

FIG. 12 is a view illustrating a film-type UV-Vis light absorption spectrum obtained by heat treatment of a chlorobenzene solution of copolymer 3 of Example 7.

FIG. 13 is a view illustrating an electrochemical measurement result (cyclic voltammetry) of copolymer 3 of Example 7.

FIG. 14 is a view illustrating a film-type UV-Vis light absorption spectrum obtained by heat treatment of a chlorobenzene solution of copolymer 4 of Example 8.

FIG. 15 is a view illustrating an electrochemical measurement result (cyclic voltammetry) of copolymer 4 of Example 8.

FIG. 16 illustrates a current density according to a voltage of a solar cell of an organic solar cell device using copolymer 1 prepared according to Example 5.

FIG. 17 illustrates a current density according to a voltage of a solar cell of an organic solar cell device using copolymer 2 prepared according to Example 6.

FIG. 18 illustrates a current density according to a voltage of a solar cell of an organic solar cell device using copolymer 3 prepared according to Example 7.

FIG. 19 illustrates a current density according to a voltage of a solar cell of an organic solar cell device using copolymer 4 prepared according to Example 8.

FIG. 20 is a view illustrating an organic solar cell according to an exemplary embodiment of the present specification.

EXPLANATION OF REFERENCE NUMERALS AND SYMBOLS

101: Substrate
102: First electrode
103: Hole transport layer
104: Photoactive layer
105: Second electrode

BEST MODE

Hereinafter, the present specification will be described in detail.

In the present specification, the term 'unit' is a repeating structure included in monomers of a copolymer, and means a structure where the monomers are bonded in the copolymer by polymerization.

In the present specification, the term 'including unit' means inclusion in a main chain in a polymer.

In the case of a copolymer including units A, B, and C according to an exemplary embodiment of the present specification, a polymer having a large molecular weight can be synthesized, and thus the copolymer positively serves to improve morphology.

In the exemplary embodiment of the present specification, unit A is represented by any one of the following Chemical Formulas 3 to 5.

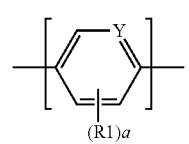

[Chemical Formula 3]

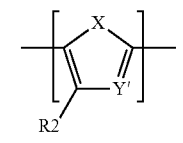

[Chemical Formula 4]

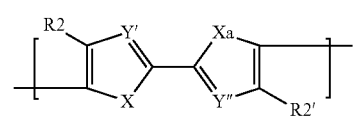

[Chemical Formula 5]

In Chemical Formulas 3 to 5,

X and Xa are the same as or different from each other, and are each independently selected from the group consisting of CRR', NR, O, SiRR', PR, S, GeRR', Se, and Te, Y is N, Y' and Y" are the same as or different from each other, and are each independently selected from the group consisting of CR, N, SiR, P, and GeR, with a proviso that X is NR or Y' is N,
with a proviso that Xa is NR or Y" is N,
a is an integer of 1 to 3, and R1, R2, R2', R, and R' are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group.

In the present specification, in the case where unit A is included, a copolymer having a large molecular weight may be provided. Accordingly, the copolymer is economical in terms of time and/or costs of manufacturing an organic solar cell. Further, a device including the copolymer having the large molecular weight may provide a device having higher efficiency as compared to a device including a copolymer having a relatively small molecular weight.

In the exemplary embodiment of the present specification, unit B is an electron donor and unit C is an electron acceptor.

In the exemplary embodiment of the present specification, unit B includes one or two or more of the following Chemical Formulas.

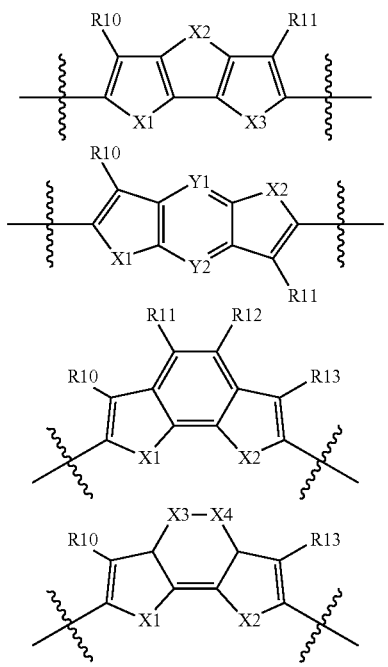

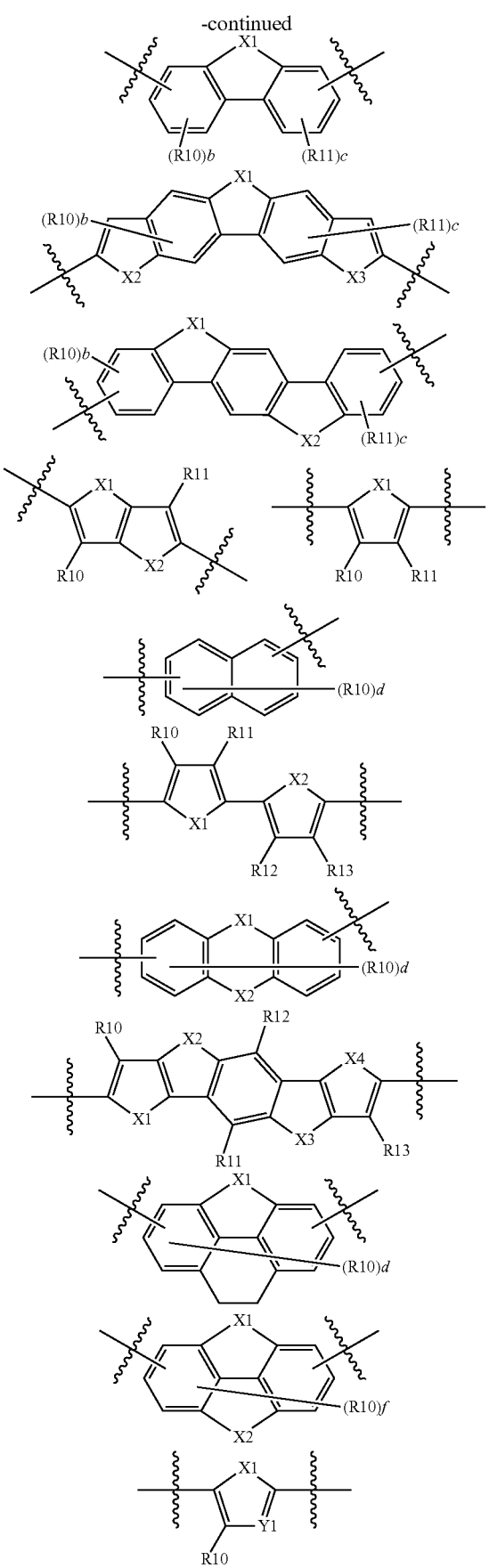

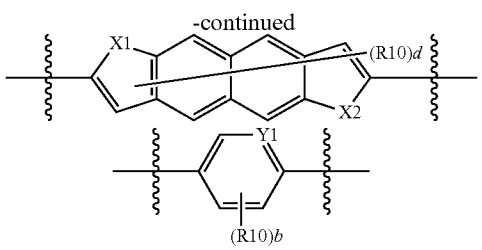

In the Chemical Formulas, b and c are each an integer of 1 to 3, d is an integer of 1 to 6, f is an integer of 1 to 4, R10 to R13 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group, X1 to X4 are the same as or different from each other, and are each independently selected from the group consisting of CR"R'", NR", O, SiR"R'", PR", S, GeR"R'", Se, and Te, Y1 and Y2 are the same as or different from each other, and are each independently selected from the group consisting of CR", N, SiR", P, and GeR", and R" and R'" are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group.

In the exemplary embodiment of the present specification, unit C includes one or two or more of the following Chemical Formulas.

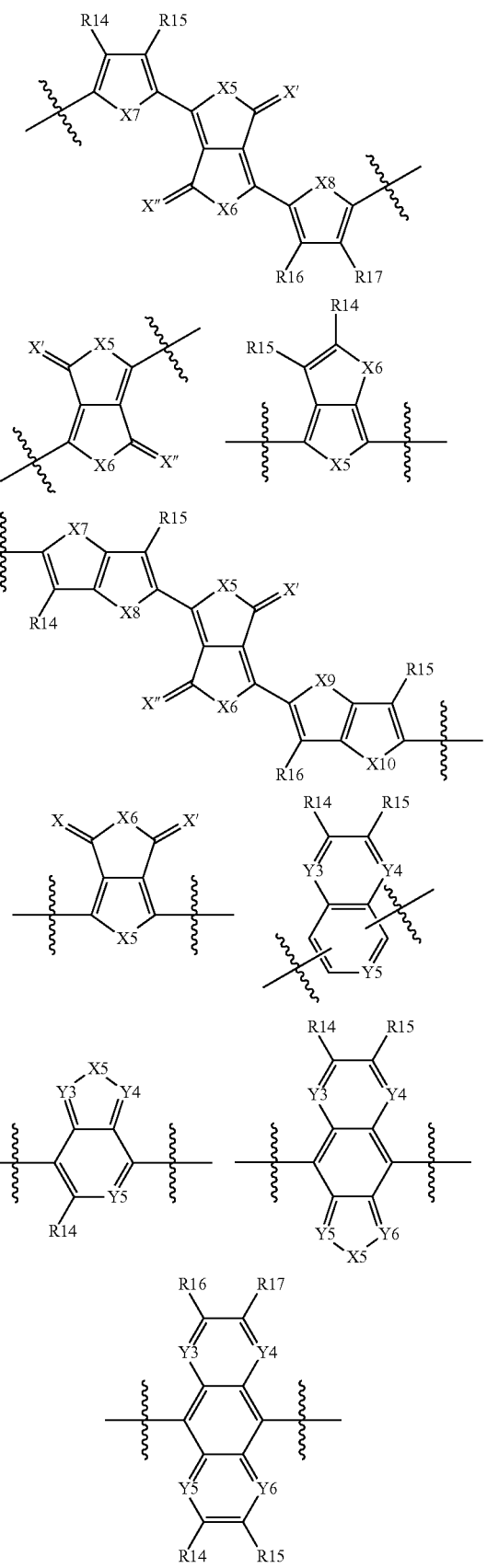

-continued

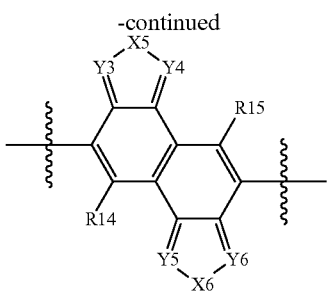

In the Chemical Formulas,

R14 to R17 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group, X' and X" are the same as or different from each other, and are each independently O or S, X5 to X10 are the same as or different from each other, and are each independently selected from the group consisting of CR18R19, NR18, O, SiR18R19, PR18, S, GeR18R19, Se, and Te, Y3 to Y6 are the same as or different from each other, and are each independently selected from the group consisting of CR18, N, SiR18, P, and GeR18, and R18 and R19 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group.

In the exemplary embodiment of the present specification, a content of unit A is 0.01 mol % to 30 mol % based on the total content of the copolymer, a content of unit B is 50 mol % to 80 mol % based on the total content of the copolymer, and a content of unit C is 0.01 mol % to 30 mol % based on the total content of the copolymer.

In the exemplary embodiment of the present specification, at least one of unit A, unit B, and unit C has a substituted or branch-chained alkoxy group or a substituted or unsubstituted branch-chained alkyl group. That is, the copolymer may include a branch-chained alkoxy group or a branch-chained alkyl group at side chains thereof.

In the exemplary embodiment of the present specification, at least one of unit A, unit B, and unit C may be substituted by one or two or more substituent groups selected from the group consisting of a substituted or unsubstituted branch-chained alkoxy group; a substituted or unsubstituted branch-chained alkyl group; and a substituent group substituted by a branch-chained alkoxy group or a branch-chained alkyl group.

That is, at least one of R1, R2, R, R', R", R''', and R10 to R23 may be substituted by a substituent group selected from the group consisting of a substituted or unsubstituted branch-chained alkoxy group; a substituted or unsubstituted branch-chained alkyl group; and a substituent group substituted by a branch-chained alkoxy group or a branch-chained alkyl group.

In this case, the copolymer including the branch-chained alkyl group or the branch-chained alkoxy group may serve to prevent formation of an excimer by aggregation between polymer chains. Further, solubility for facilitating manufacturing the organic solar cell may be provided. Accordingly, the organic solar cell according to the exemplary embodiment of the present specification may provide high efficiency.

Examples of the "substituent group" include an alkyl group; an alkenyl group; an alkoxy group; a cycloalkyl group; a silyl group; an arylalkenyl group; an aryloxy group; an alkylthioxy group; an alkylsulfoxy group; an arylsulfoxy group; a boron group; an alkylamine group; an aralkylamine group; an arylamine group; a heteroaryl group; an arylamine group; an aryl group; a hetero-cyclic group, and the like, but are not limited thereto.

In the exemplary embodiment of the present specification, X is S.

In the exemplary embodiment of the present specification, Y' is N.

In the exemplary embodiment of the present specification, Xa is S.

In the exemplary embodiment of the present specification, Y" is N.

In the exemplary embodiment of the present specification, unit A is the following Chemical Formula 4-1 or 5-1.

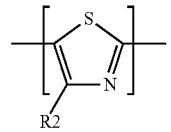

[Chemical Formula 4-1]

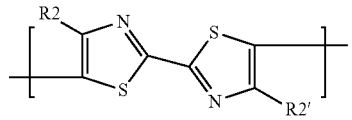

[Chemical Formula 5-1]

In Chemical Formulas 4-1 and 5-1,

R2 and R2' are the same as or different from each other, and are hydrogen; or a substituted or unsubstituted alkyl group.

In the exemplary embodiment of the present specification, R2 is hydrogen.

In the exemplary embodiment of the present specification, R2 is a substituted or unsubstituted alkyl group.

In the exemplary embodiment of the present specification, R2 is an alkyl group.

In the exemplary embodiment of the present specification, R2 is a nonyl group.

In the exemplary embodiment of the present specification, R2' is hydrogen.

In the exemplary embodiment of the present specification, R2' is a substituted or unsubstituted alkyl group.

In the exemplary embodiment of the present specification, R2' is an alkyl group.

In the exemplary embodiment of the present specification, R2' is a nonyl group.

Examples of the substituent groups will be described below, but are not limited thereto.

In the present specification,

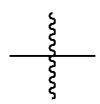

means a portion connected to the main chain of the copolymer or a portion connected to another substituent group.

In the present specification, the term "substituted or unsubstituted" means that substitution is performed by one or two or more substituent groups selected from the group consisting of deuterium; a halogen group; an alkyl group; an alkenyl group; an alkoxy group; a cycloalkyl group; a silyl group; an arylalkenyl group; an aryloxy group; an alkylthioxy group; an alkylsulfoxy group; an arylsulfoxy group; a boron group; an alkylamine group; an aralkylamine group; an arylamine group; a heteroaryl group; an arylamine group; an aryl group; a nitrile group; a nitro group; a hydroxy group; and a hetero-cyclic group, substitution is performed by a substituent group where two or more substituent groups of the exemplified substituent groups are connected, or there is no substituent group. For example, the "substituent group where two or more substituent groups are connected" may be a biphenyl group. That is, the biphenyl group may be an aryl group, or may be interpreted as a substituent group where two phenyl groups are connected. The term "substituted or unsubstituted" means that substitution is performed by the substituent group where two or more substituent groups of the exemplified substituent groups are connected or there is no substitution. For example, the "substituent group where two or more substituent groups are connected" may be a biphenyl group. That is, the biphenyl group may be an aryl group, or may be interpreted as a substituent group where two phenyl groups are connected.

The term "substituted" means that a hydrogen atom bonded to a carbon atom of a compound is changed into another substituent group, a substitution position is not limited as long as the substitution position is a position at which the hydrogen atom is substituted, that is, a position at which the substituent group can be substituted, and in the case where two or more atoms are substituted, two or more substituent groups may be the same as or different from each other.

In the present specification, the number of carbon atoms of an imide group is not particularly limited but is preferably 1 to 25. Specifically, the imide group may be compounds having the following structures, but is not limited thereto.

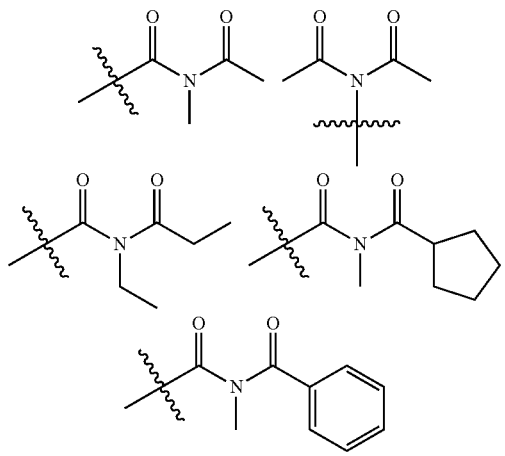

In the present specification, one or two nitrogen atoms of an amide group may be substituted by hydrogen, a straight-chained, branch-chained, or cyclic-chained alkyl group having 1 to 25 carbon atoms, or an aryl group having 6 to 25 carbon atoms. Specifically, the amide group may be compounds having the following Structural Formulas, but is not limited thereto.

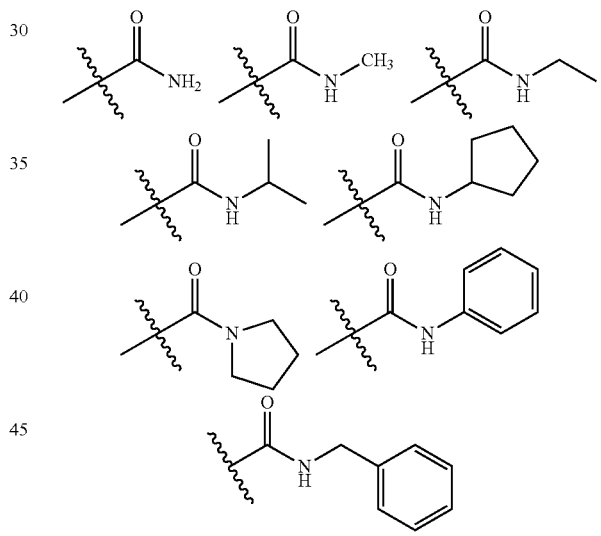

In the present specification, the alkyl group may be a straight or branch chain, and the number of carbon atoms thereof is not particularly limited but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, a cycloalkyl group is not particularly limited, but the number of carbon atoms thereof is preferably 3 to 60, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be a straight, branch, or cyclic chain. The number of carbon atoms of the alkoxy group is not particularly limited, but preferably 1 to 20. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be a straight or branch chain, and the number of carbon atoms thereof is not particularly limited but is preferably 2 to 40. Specific examples thereof include vinyl, 1-prophenyl, iso-prophenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenyl-vinyl-1-yl, 2-phenyl-2-(naphthyl-1-yl)vinyl-1-yl, 2,2-bis(di-phenyl-1-yl)vinyl-1-yl, a stilbenyl group, a styrenyl group, and the like, but are not limited thereto.

In the present specification, the aryl group may be a monocyclic aryl group or a polycyclic aryl group, and includes the case where an alkyl group having 1 to 25 carbon atoms or an alkoxy group having 1 to 25 carbon atoms is substituted. Further, in the present specification, the aryl group may mean an aromatic cycle.

In the case where the aryl group is the monocyclic aryl group, the number of carbon atoms thereof is not particularly limited but is preferably 6 to 25. Specific examples of the monocyclic aryl group may include a phenyl group, a biphenyl group, a terphenyl group, and the like, but are not limited thereto.

In the case where the aryl group is the polycyclic aryl group, the number of carbon atoms thereof is not particularly limited but is preferably 10 to 24. Specific examples of the polycyclic aryl group may include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and the adjacent substituent groups may be bonded to each other to form a cycle.

In the case where the fluorenyl group is substituted,

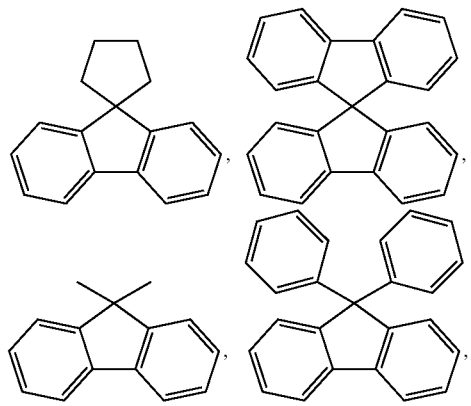

and the like may be formed. However, the fluorenyl group is not limited thereto.

In the present specification, specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, the number of carbon atoms of the amine group is not particularly limited, but preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

In the present specification, examples of the arylamine group include a substituted or unsubstituted monoarylamine group, a substituted or unsubstituted diarylamine group, or a substituted or unsubstituted triarylamine group. The aryl group of the arylamine group may be a monocyclic aryl group or a polycyclic aryl group. The arylamine group including two or more aryl groups may include the monocyclic aryl group, the polycyclic aryl group, or both the monocyclic aryl group and the polycyclic aryl group.

Specific examples of the arylamine group include phenylamine, naphthylamine, biphenylamine, anthracenylamine, 3-methyl-phenylamine, 4-methyl-naphthylamine, 2-methyl-biphenylamine, 9-methyl-anthracenylamine, a diphenylamine group, a phenylnaphthylamine group, a ditolylamine group, a phenyltolylamine group, carbazole, a triphenylamine group, and the like, but are not limited thereto.

In the present specification, the hetero-cyclic group includes an atom other than carbon, or one or more heteroatoms, and specifically, the heteroatom may include one or more atoms selected from the group consisting of O, N, Se, S, and the like. The number of carbon atoms of the hetero-cyclic group is not particularly limited, but preferably 2 to 60. Examples of the hetero-cyclic group include a thiophene group, a furan group, a pyrrole group, an imidazole group, a triazole group, an oxazol group, an oxadiazol group, a triazol group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the aryl group of an aryloxy group, an arylthioxy group, an arylsulfoxy group, and an aralkylamine group is the same as the aforementioned examples of the aryl group. Specific examples of the aryloxy group include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, and the like, specific examples of the arylthioxy group include a phenylthioxy group, a 2-methylphenylthioxy group, a 4-tert-butylphenylthioxy group, and the like, and specific examples of the arylsulfoxy group include a benzenesulfoxy group, a p-toluenesulfoxy group, and the like, but the examples are not limited thereto.

In the present specification, the heteroaryl group of the heteroarylamine group may be selected from the aforementioned examples of the hetero-cyclic group.

In the present specification, the alkyl group of an alkylthioxy group and an alkylsulfoxy group is the same as the aforementioned examples of the alkyl group. Specific examples of the alkylthioxy group include a methylthioxy group, an ethylthioxy group, a tert-butylthioxy group, a hexylthioxy group, an octylthioxy group, and the like, and specific examples of the alkylsulfoxy group include mesyl, an ethylsulfoxy group, a propylsulfoxy group, a butylsulfoxy group, and the like, but the examples are not limited thereto.

In the exemplary embodiment of the present specification, unit B is

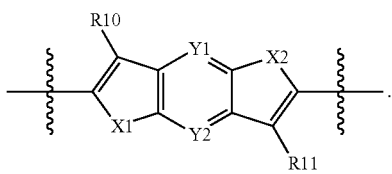

In the exemplary embodiment of the present specification, unit B is

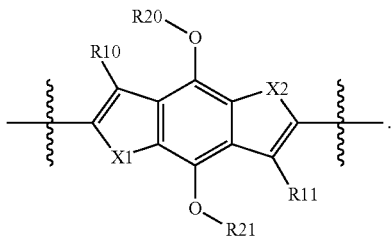

In the exemplary embodiment of the present specification, unit B is

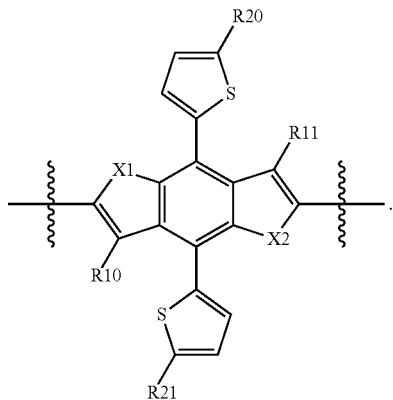

X1, X2, R10, and R11 are the same as those described in the above, and R20 and R21 are the same as or different from each other and definitions thereof are each independently the same as definitions of R10 and R11.

In the present specification, there is a merit in that in the case where unit B as described above is included, solubility of the copolymer is increased to easily manufacture the device.

In the exemplary embodiment of the present specification, unit C is

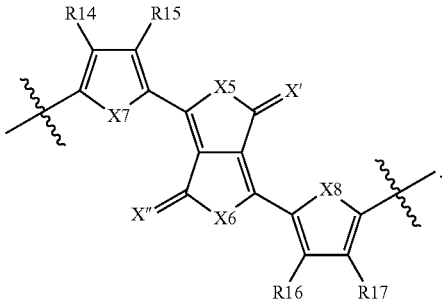

X5 to X8, R14 to R17, X', and X" are the same as those described in the above.

In the exemplary embodiment of the present specification, the copolymer includes a unit represented by any one of the following Chemical Formulas 1-1 to 1-3.

[Chemical Formula 1-1]

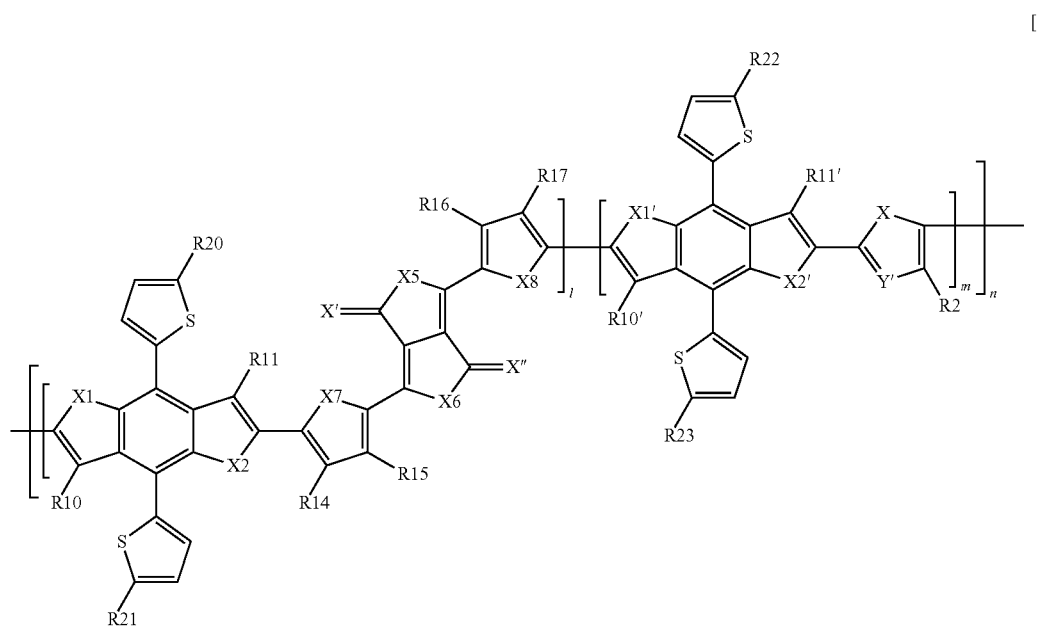

[Chemical Formula 1-2]

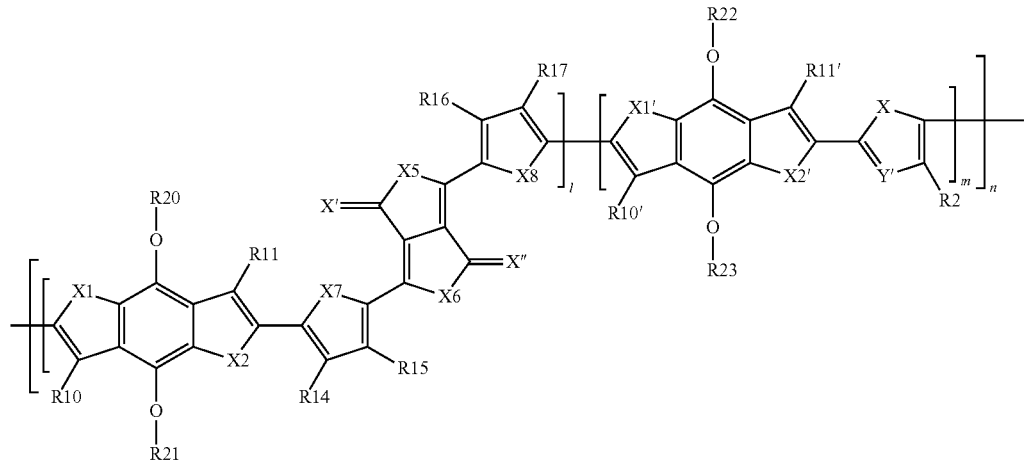

[Chemical Formula 1-3]

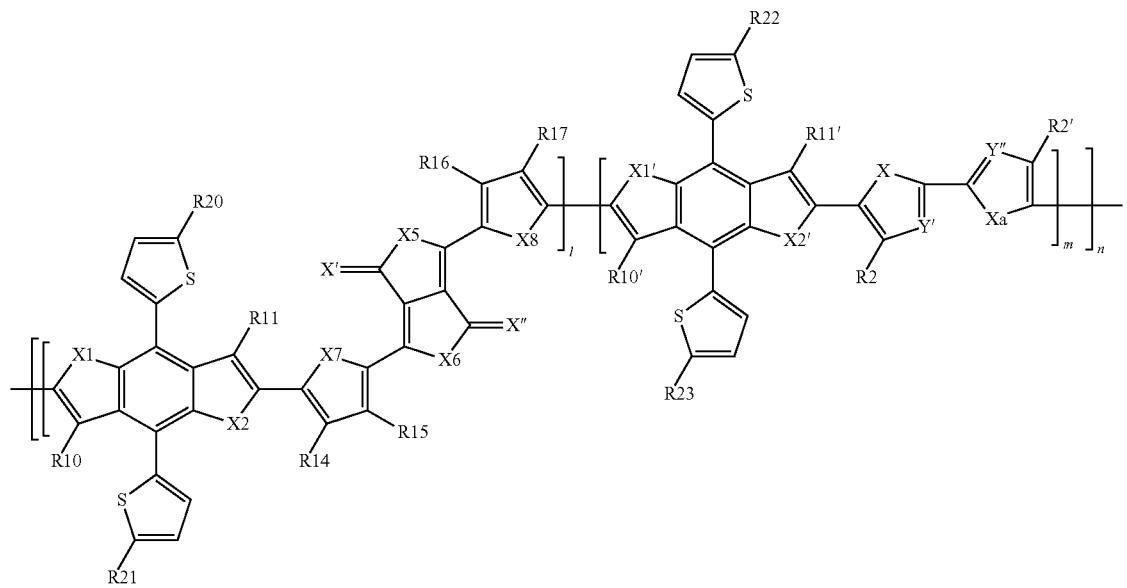

In Chemical Formulas 1-1 to 1-3, X and Xa are the same as or different from each other, and are each independently selected from the group consisting of CRR', NR, O, SiRR', PR, S, GeRR', Se, and Te, Y' and Y" are the same as or different from each other, and are each independently selected from the group consisting of CR, N, SiR, P, and GeR, with a proviso that X is NR or Y' is N,
with a proviso that Xa is NR or Y" is N,
l is a mol fraction and a real number of more than 0 and less than 1,
m is a mol fraction and a real number of more than 0 and less than 1,
a sum of l and m is 1,
n is an integer of 1 to 10,000, R2, R2', R10, R11, R10', R11', R14 to R17, and R20 to R23 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group, X' and X" are the same as or different from each other, and are each independently O or S, X1, X2, X1', and X2' are the same as or different from each other, and are each independently selected from the group consisting of CR"R''', NR", O, SiR"R''', PR", S, GeR"R''', Se, and Te, X5 to X8 are the same as or different from each other, and are each independently selected from the group consisting of CR18R19, NR18, O, SiR18R19, PR18, S, GeR18R19, Se, and Te, and R″, R‴, R18, and R19 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group.

In the exemplary embodiment of the present specification, R10 is hydrogen.

In the exemplary embodiment of the present specification, R11 is hydrogen.

In the exemplary embodiment of the present specification, R10' is hydrogen.

In the exemplary embodiment of the present specification, R11' is hydrogen.

In the exemplary embodiment of the present specification, R14 is hydrogen.

In the exemplary embodiment of the present specification, R15 is hydrogen.

In the exemplary embodiment of the present specification, R16 is hydrogen.

In the exemplary embodiment of the present specification, R17 is hydrogen.

In the exemplary embodiment of the present specification, X1 is S.

In the exemplary embodiment of the present specification, X2 is S.

In the exemplary embodiment of the present specification, X1' is S.

In the exemplary embodiment of the present specification, X2' is S.

In the exemplary embodiment of the present specification, X' is O.

In the exemplary embodiment of the present specification, X″ is O.

In the exemplary embodiment of the present specification, Y1 is CR″.

In the exemplary embodiment of the present specification, Y2 is CR″.

In the exemplary embodiment of the present specification, X5 is NR18.

In the exemplary embodiment of the present specification, X6 is NR18.

In the exemplary embodiment of the present specification, R18 is a substituted or unsubstituted alkyl group.

In the exemplary embodiment of the present specification, R18 is a substituted or unsubstituted branch-chained alkyl group.

In the exemplary embodiment of the present specification, R18 is a branch-chained 2-ethylhexyl group.

In the exemplary embodiment of the present specification, R″ is a substituted or unsubstituted alkoxy group.

In the exemplary embodiment of the present specification, R″ is a substituted or unsubstituted branch-chained alkoxy group.

In the exemplary embodiment of the present specification, R″ is a branch-chained 2-ethylhexyloxy group.

In the exemplary embodiment of the present specification, R″ is a substituted or unsubstituted hetero-cyclic group.

In the exemplary embodiment of the present specification, R″ is a substituted or unsubstituted thiophene group.

In the exemplary embodiment of the present specification, R″ is a thiophene group substituted by an alkyl group.

In the exemplary embodiment of the present specification, R″ is a thiophene group substituted by a hexyl group.

In the exemplary embodiment of the present specification, R″ is a thiophene group substituted by an ethylhexyl group.

In the exemplary embodiment of the present specification, X7 is S.

In the exemplary embodiment of the present specification, X8 is S.

In the exemplary embodiment of the present specification, the copolymer includes any one of the following copolymers 1 to 4.

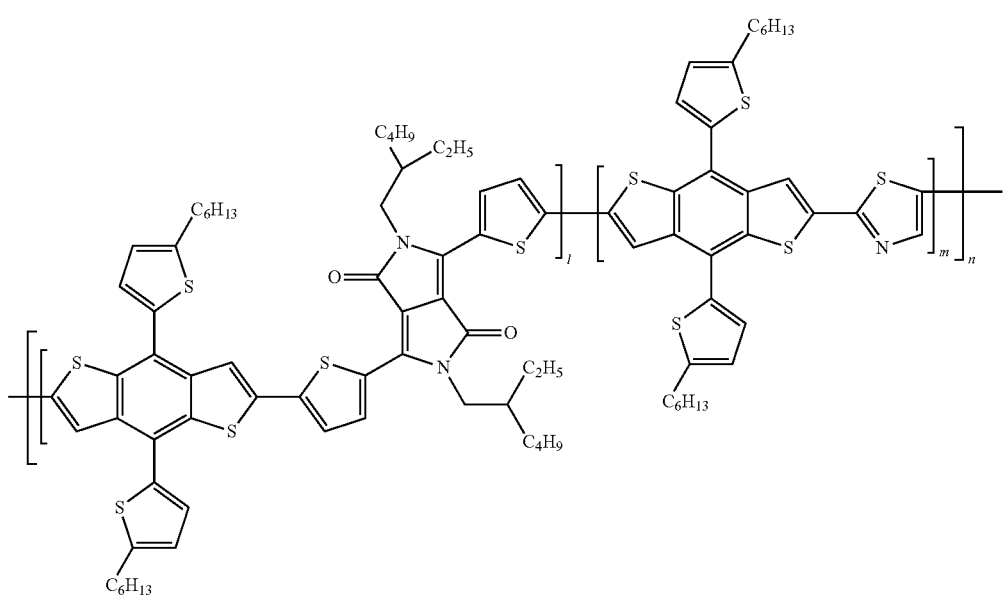

[Copolymer 1]

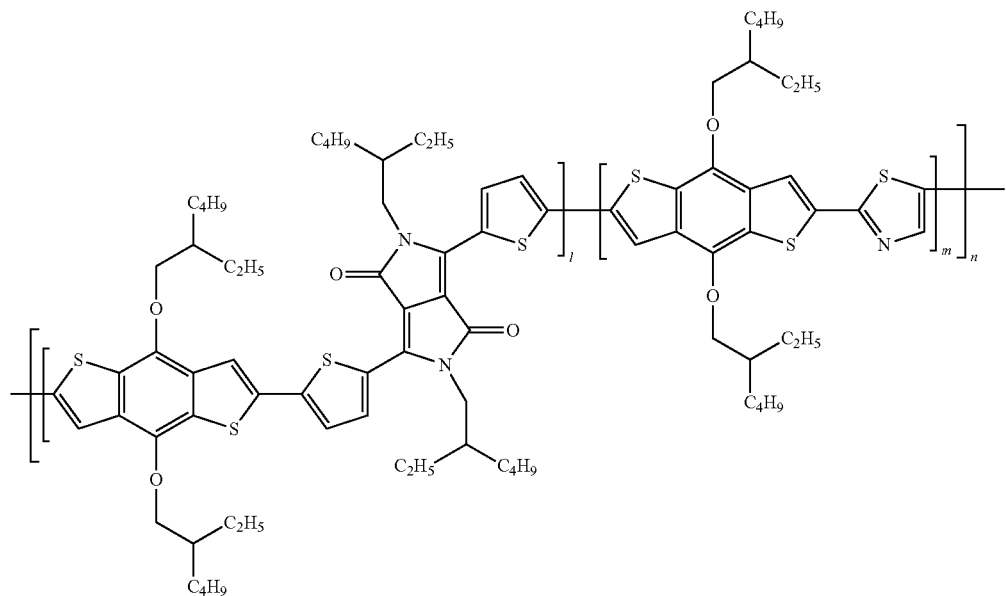
[Copolymer 2]
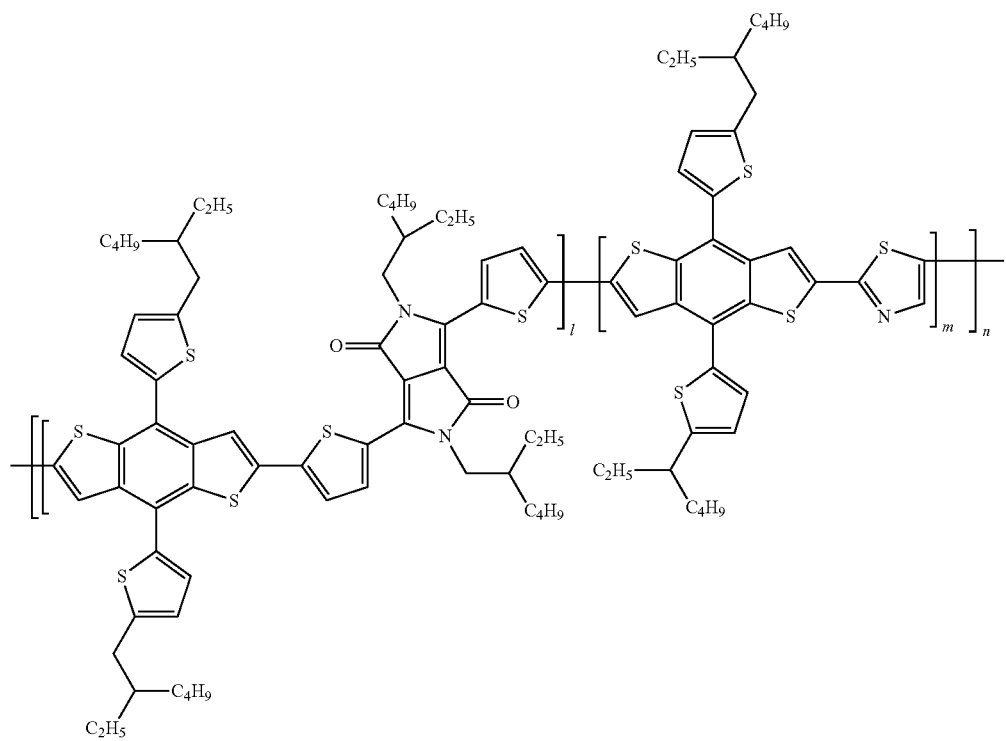
[Copolymer 3]

-continued

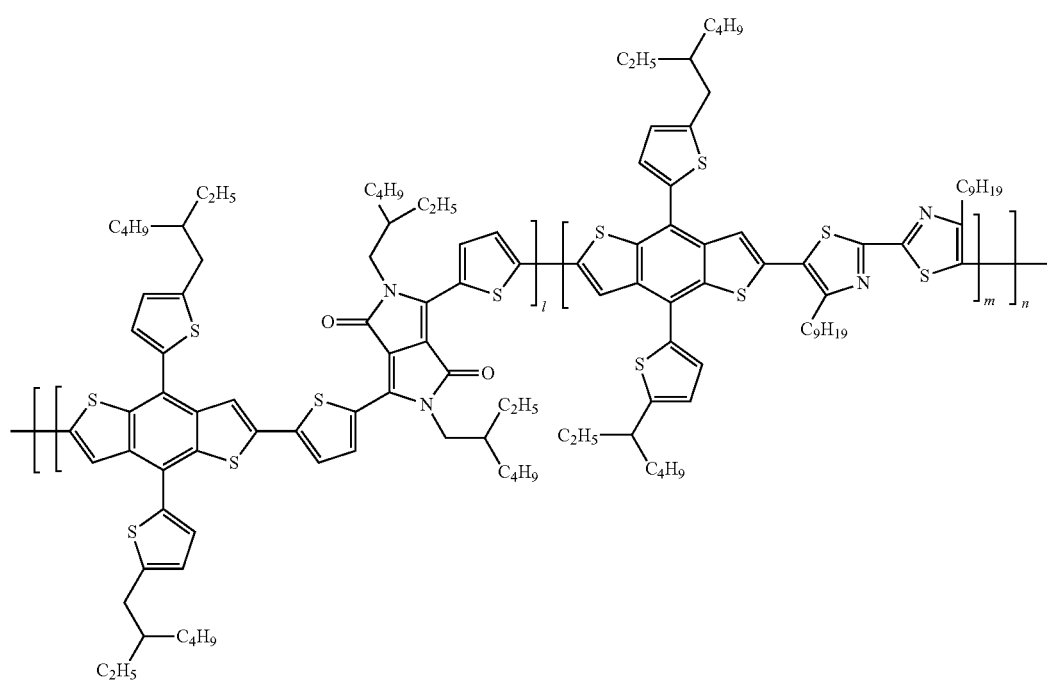

[Copolymer 4]

l is a mol fraction and a real number of more than 0 and less than 1, m is a mol fraction and a real number of more than 0 and less than 1, a sum of l and m is 1, and n is an integer of 1 to 10,000.

In the exemplary embodiment of the present specification, m is 0.5.

In the exemplary embodiment of the present specification, l is 0.5.

In the exemplary embodiment of the present specification, examples of an end group of the copolymer include a hetero-cyclic group or an aryl group.

In the exemplary embodiment of the present specification, the end group of the copolymer is a 4-(trifluoromethyl) phenyl group.

According to the exemplary embodiment of the present specification, it is preferable that a number average molecular weight of the copolymer be 500 g/mol to 1,000,000 g/mol. It is preferable that the number average molecular weight of the copolymer be 10,000 to 100,000. In the exemplary embodiment of the present specification, the number average molecular weight of the copolymer is 30,000 to 100,000.

According to the exemplary embodiment of the present specification, the copolymer may have a molecular weight distribution of 1 to 100. Preferably, the copolymer has the molecular weight distribution of 1 to 3.

As the molecular weight distribution is reduced and the number average molecular weight is increased, electric and mechanical properties are further improved.

Further, in order to secure a predetermined solubility or more and thus make application of a solution coating method advantageous, it is preferable that the number average molecular weight be 100,000 or less.

The aforementioned copolymers may be prepared based on Preparation Examples as will be described later.

The copolymer may be prepared by addedting a catalyst and a solvent into three kinds of monomers, reacting the resulting substances, performing end capping, precipitating a mixture in methanol, and extracting a solid. As described above, a copolymer including units A, B, and C may be prepared in addition to copolymers 1 and 2 by selecting three kinds of monomers according to physical properties required in the copolymer by a person with ordinary skill.

The copolymer according to the present specification may be prepared by a multi-stage chemical reaction. After monomers are prepared through an alkylation reaction, a Grignard reaction, a Suzuki coupling reaction, a Stille coupling reaction, or the like, the final copolymers may be prepared through a carbon-carbon coupling reaction such as the Stille coupling reaction. In the case where a substituent group to be introduced is a boronic acid or boronic ester compound, the copolymer may be prepared through the Suzuki coupling reaction, and in the case where the substituent group to be introduced is a tributyltin compound, the copolymer may be prepared through the Stille coupling reaction, but the reaction is not limited thereto.

An exemplary embodiment of the present specification provides an organic solar cell including a first electrode; a second electrode provided to face the first electrode; and one or more organic material layers provided between the first electrode and the second electrode and including a photoactive layer, in which one or more layers of the organic material layers include the copolymer.

The organic solar cell according to the exemplary embodiment of the present specification includes the first electrode, the photoactive layer, and the second electrode. The organic solar cell may further include a substrate, a hole transport layer, and/or an electron transport layer.

In the exemplary embodiment of the present specification, if the organic solar cell accepts a photon from an external light source, electrons and holes are generated between an electron donor and an electron acceptor. The generated holes are transported through an electron donor layer to an anode.

In the exemplary embodiment of the present specification, the organic material layer includes a hole transport layer, a hole injection layer, or a layer simultaneously transporting and injecting holes, and the hole transport layer, the hole injection layer, or the layer simultaneously transporting and injecting the holes includes the copolymer.

In another exemplary embodiment, the organic material layer includes an electron injection layer, an electron transport layer, or a layer simultaneously injecting and transporting electrons, and the electron injection layer, the electron transport layer, or the layer simultaneously injecting and transporting the electrons includes the copolymer.

FIG. 20 is a view illustrating the organic solar cell according to the exemplary embodiment of the present specification.

In the exemplary embodiment of the present specification, if the organic solar cell accepts the photon from the external light source, the electrons and the holes are generated between the electron donor and the electron acceptor. The generated holes are transported through the electron donor layer to the anode.

In the exemplary embodiment of the present specification, the organic solar cell may further include an additional organic material layer. In the organic solar cell, the number of organic material layers may be reduced by using an organic material simultaneously having various functions.

In the exemplary embodiment of the present specification, the first electrode is an anode, and the second electrode is a cathode. In another exemplary embodiment, the first electrode is the cathode, and the second electrode is the anode.

In the exemplary embodiment of the present specification, in the organic solar cell, the cathode, the photoactive layer, and the anode may be disposed in order, or the anode, the photoactive layer, and the cathode may be disposed in order, but the order is not limited thereto.

In another exemplary embodiment, in the organic solar cell, the anode, the hole transport layer, the photoactive layer, the electron transport layer, and the cathode may be disposed in order, or the cathode, the electron transport layer, the photoactive layer, the hole transport layer, and the anode may be disposed in order, but the order is not limited thereto.

In the exemplary embodiment of the present specification, the organic solar cell has a normal structure.

In the exemplary embodiment of the present specification, the organic solar cell has an inverted structure.

In the exemplary embodiment of the present specification, the organic solar cell has a tandem structure.

The organic solar cell according to the exemplary embodiment of the present specification may include one or two or more photoactive layers.

In another exemplary embodiment, a buffer layer may be provided between the photoactive layer and the hole transport layer or between the photoactive layer and the electron transport layer. In this case, the hole injection layer may be further provided between the anode and the hole transport layer. Further, the electron injection layer may be further provided between the cathode and the electron transport layer.

In the exemplary embodiment of the present specification, the photoactive layer includes one or two or more selected from the group consisting of the electron donor and the electron acceptor, and a material of the electron donor includes the copolymer.

In the exemplary embodiment of the present specification, a material of the electron acceptor may be selected from the group consisting of fullerene, a fullerene derivative, bathocuproin, a semiconducting element, a semiconducting compound, and a combination thereof. Specifically, the material is one or two or more compounds selected from the group consisting of fullerene, a fullerene derivative (PCBM ((6,6)-phenyl-C61-butyric acid-methylester) or PCBCR ((6,6)-phenyl-C61-butyric acid-cholesteryl ester), perylene, PBI (polybenzimidazole), and PTCBI (3,4,9,10-perylene-tetracarboxylic bis-benzimidazole).

In the exemplary embodiment of the present specification, the electron donor and the electron acceptor constitute a bulk hetero junction (BHJ). The material of the electron donor and the material of the electron acceptor are mixed at a ratio (w/w) of 1:10 to 10:1.

The bulk hetero junction means a mixed state of the material of the electron donor and the material of the electron acceptor in the photoactive layer.

In the exemplary embodiment of the present specification, the photoactive layer has a bilayered thin film structure including an n-type organic material layer and a p-type organic material layer, and the p-type organic material layer includes the copolymer.

In the present specification, the substrate may be a glass substrate or a transparent plastic substrate having excellent transparency, surface flatness, easiness in handling, and water resistance, but is not limited thereto, and there is no limitation as long as the substrate is a substrate generally used in the organic solar cell. Specific examples thereof include glass, PET (polyethylene terephthalate), PEN (polyethylene naphthalate), PP (polypropylene), PI (polyimide), TAC (triacetyl cellulose), or the like, but are not limited thereto.

The anode electrode may be a material having transparency and excellent conductivity, but is not limited thereto. Examples thereof include metal such as vanadium, chrome, copper, zinc, and gold, or an alloy thereof; metal oxides such as zinc oxides, indium oxides, indium tin oxides (ITO), and indium zinc oxides (IZO); a combination of metal and oxides, such as $ZnO:Al$ or $SnO_2:Sb$; conductive polymers such as poly(3-methylthiophene), poly[3,4-(ethylene-1,2-dioxy)thiophene] (PEDOT), polypyrole, and polyaniline, and the like, but are not limited thereto.

A method of forming the anode electrode is not particularly limited, but for example, the anode electrode may be formed by application on one surface of the substrate or coating in a film form by using saddedtering, E-beam, thermal deposition, spin coating, screen printing, inkjet printing, doctor blade, or a gravure printing method.

In the case where the anode electrode is formed on the substrate, the anode electrode may be subjected to washing, water removing, and a hydrophilic reforming process.

For example, a patterned ITO substrate is sequentially washed by a cleaning agent, acetone, and isopropyl alcohol (IPA), and then dried on a hot plate at 100 to 150° C. for 1 to 30 minutes and preferably at 120° C. for 10 minutes in order to remove moisture, and if the substrate is completely washed, a surface of the substrate is subjected to hydrophilic reforming.

A conjunction surface potential may be maintained at a level suitable for a surface potential of the photoactive layer through the aforementioned surface reforming. Further, while reforming is performed, it is possible to easily form a polymer thin film on the anode electrode, and the quality of the thin film may be improved.

Examples of a pre-treatment technology of the anode electrode include a) a surface oxidizing method using parallel plate-type discharging, b) a method of oxidizing a surface through ozone generated by using ultraviolet rays in a vacuum state, c) a method of performing oxidizing by using oxygen radicals generated by a plasma, and the like.

Any one of the aforementioned methods may be selected according to a state of the anode electrode or the substrate. However, whichever method is used, commonly, it is preferable to prevent leaving of oxygen from the surface of the anode electrode or the substrate and maximally suppress staying of moisture and the organic material. In this case, a substantial effect of pre-treatment may be maximized.

Specific examples thereof may include the method of oxidizing the surface through ozone generated by using the ultraviolet rays. In this case, after washing by ultrasonic waves, the patterned ITO substrate may be baked on the hot plate to be well dried, and then added into a chamber, and a UV lamp may be operated to wash the patterned ITO substrate by ozone generated by reacting oxygen gas and the ultraviolet rays.

However, in the present specification, a method of reforming the surface of the patterned ITO substrate does not need to be particularly limited, and any method may be used as long as the method is a method of oxidizing the substrate.

The cathode electrode may be metal having a small work function, but is not limited thereto. Specific examples thereof may include metal such as magnesium, calcium, sodium, potassium, titanium, indium, yttrium, lithium, gadolinium, aluminum, silver, tin, and lead, or an alloy thereof; and a material having a multilayered structure, such as LiF/Al, LiO$_2$/Al, LiF/Fe, Al:Li, Al:BaF$_2$, and Al:BaF$_2$:Ba, but are not limited thereto.

The cathode electrode may be formed by being deposited in a thermal deposition machine having the degree of vacuum of 5×10$^{-7}$ torr or less, but the forming method is not limited to this method.

Hole transport layer and/or electron transport layer materials serve to efficiently transport the electrons and the holes separated from the photoactive layer to the electrode, and the materials are not particularly limited.

The hole transport layer material may be PEDOT:PSS (poly(3,4-ethylenediocythiophene) doped with poly(styrenesulfonic acid)), molybdenum oxides (MoO$_x$); vanadium oxides (V$_2$O$_5$); nickel oxides (NiO); tungsten oxides (WO$_x$), or the like, but is not limited thereto.

The electron transport layer material may be electron-extracting metal oxides, and specific examples thereof may include a metal complex of 8-hydroxyquinoline; a complex including Alq$_3$; a metal complex including Liq; LiF; Ca; titanium oxides (TiO$_x$); zinc oxides (ZnO); cesium carbonate (Cs$_2$CO$_3$), or the like, but are not limited thereto.

The photoactive layer may be formed by a method where a photoactive material such as the electron donor and/or the electron acceptor is dissolved in an organic solvent and a solution is then subjected to spin coating, dip coating, screen printing, spray coating, doctor blade, brush painting, or the like, but the forming method is not limited to these methods.

A method of preparing the copolymer and manufacturing of the organic solar cell including the same will be described in detail in the following Preparation Examples and Examples. However, the following Examples are set forth to illustrate the present specification, but the scope of the present specification is not limited thereto.

Example 1. Synthesis of monomer (synthesis of 3,6-bis(5-bromo-2-thienyl)-2,5-bis(2-ethylhexyl)-2,5-dihydropyrrolo[3,4-c]pyrrole-1,4-dione)—1'

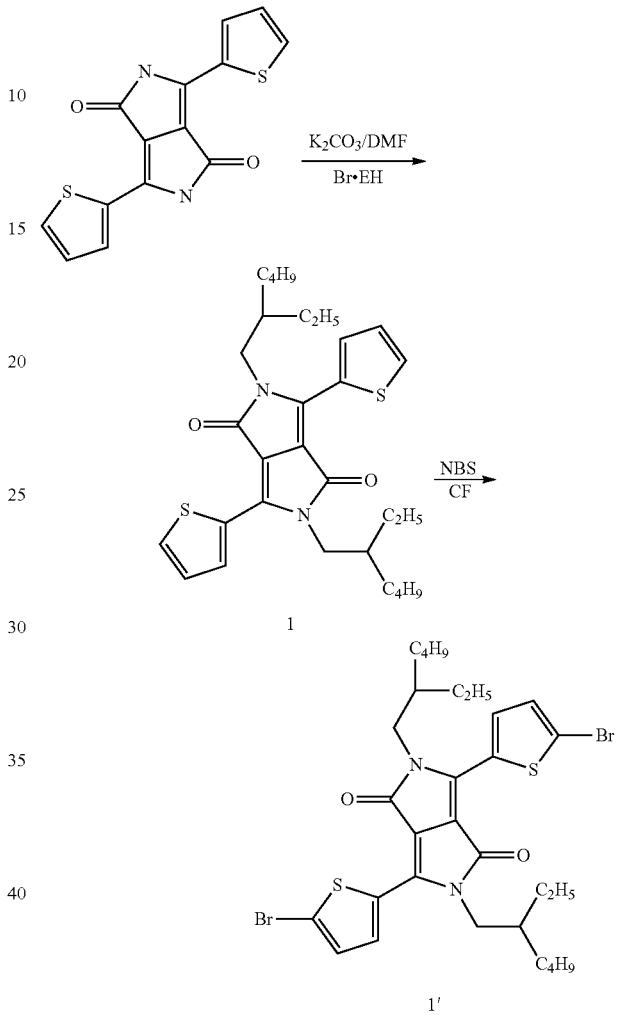

1. 3,6-dithiophen-2-yl-2,5-dihydropyrrolo[3,4-c]pyrrole-1,4-dione (13.0 g, 43.3 mmol) and potassium carbonate (K$_2$CO$_3$, 24.0 g) were added into 250 ml of dimethylformamide (DMF), and then heated to 145° C. to be well dissolved. 2-ethylhexylbromide (38.6 g, 200 mmol) was added into the solution at once by using the syringe. Agitation was performed at 145° C. for 15 hours or more, the temperature was reduced to room temperature, and the resulting solution was poured onto 500 ml or more of cold water, agitated, and filtered while being washed several times by water and alcohol. After drying, the dark violet solid powder was obtained through the silica column (eluent; hexane:methylene chloride=1:10).

Yield: 87.4%

FIG. 1 is a view illustrating an NMR spectrum of 2,5-diethylhexyl-3,6-dithiophene-2-ylpyrrolo[3,4-c]pyrrole-1,4-dione of Example 1.

1'. 2,5-ethylhexyl-3,6-dithiophene-2-ylpyrrolo[3,4-c]pyrrole-1,4-dione (15.0 g, 28.5 mmol) and N-bromosuccinimide (NBS, 10.4 g, 58.4 mmol) were well agitated in 600 ml of chloroform at room temperature in a state where light was blocked. After the reaction was confirmed by the thin-layer chromatography, the dark violet solid powder was obtained through the silica column (eluent; hexane:methylene chloride=1:10).

Yield: 79.4%

FIG. 2 is a view illustrating an NMR spectrum of 3,6-bis(5-bromo-2-thienyl)-2,5-bis(2-ethylhexyl)-2,5-dihydropyrrolo[3,4-c]pyrrole-1,4-dione of Example 1.

FIG. 3 is a view illustrating an MS spectrum of 3,6-bis(5-bromo-2-thienyl)-2,5-bis(2-ethylhexyl)-2,5-dihydropyrrolo[3,4-c]pyrrole-1,4-dione of Example 1.

Example 2. Synthesis of monomer—2' (synthesis of 2,6-bis(trimethyltin)-4,8-di(2-ethylhexyloxy)benzo[1,2-b:4,5-b']dithiophene)

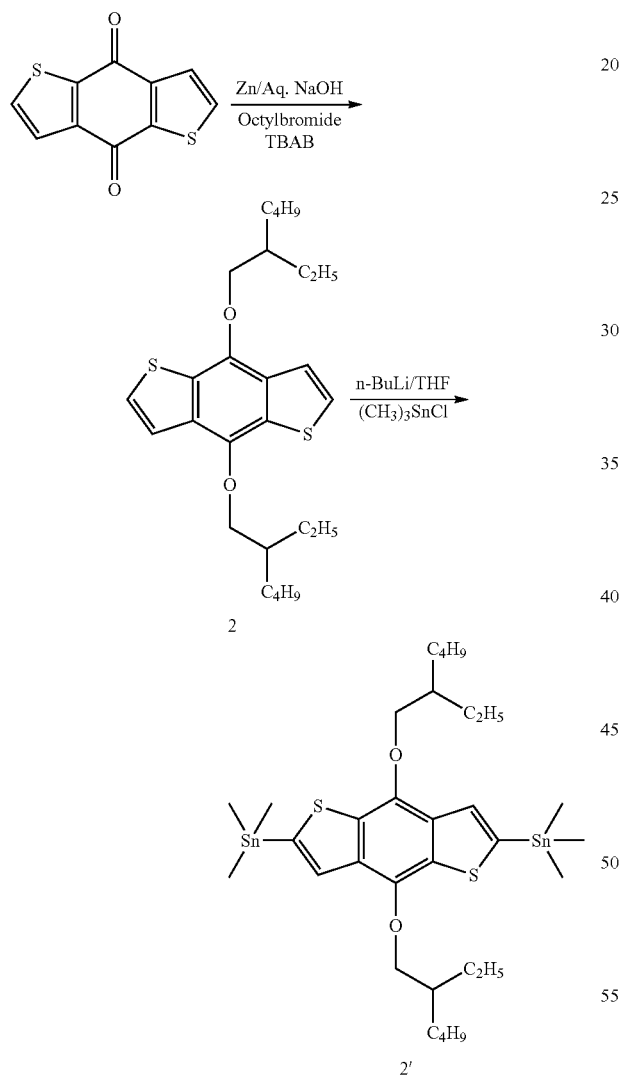

2. After 4,8-dihydrobenzo[1,2-b:4,5-b']dithiophene-4,8-dione (8.0 g, 36.2 mmol) and the Zn powder (5.2 g, 79.6 mmol) were added into 60 ml of DI water ($H_2O$) and agitated, sodium hydroxide (NaOH, 24 g) was added, agitated, and refluxed for 1 hour. During the reaction, the color of the solution was changed from yellow via red to orange. 2-ethylhexylbromide (21.0 g, 108.9 mmol) and tetrabutylammonium bromide (as a catalyst) were added into the solution, and followed by agitating/refluxing for 2 hours. If the color of the solution was red or dark red, the zinc powder was further added, and followed by agitating/refluxing for 6 hours. The solution was poured on cold water, and extracted by diethyl ether two times, and the residual material was then removed by magnesium sulfate ($MgSO_4$). The residual solution was subjected to pressure reduction to remove the solvent, and the colorless liquid was obtained through the silica column (eluent; Pet ether:MC=9:1).

Yield: 64.9%

2'. 2 (10.3 g, 23.1 mmol) was added into 50 ml of tetrahydrofuran (THF) and dissolved, and the temperature was then reduced to −78° C. 1.6M n-BuLi (1.6M n-butyllithium in hexane, 31.7 ml, 50.8 mmol) dissolved in hexane at this temperature was slowly added, and followed by agitating for 30 minutes. Thereafter, the temperature was increased to 0° C., agitation was performed in this state for 1 hours, the temperature was reduced back to −78° C., 1M trimethyltin chloride (trimethyltin chloride in THF, 53.1 ml, 53.1 mmol) dissolved in THF was added at once, the temperature was increased to room temperature, and agitation was performed for 12 hours. The solution was poured on ice, extracted by diethyl ether two times, and washed by water two times, and the residual material was removed by magnesium sulfate ($MgSO_4$). The solvent was removed from the residual solution under reduced pressure, and recrystallization was performed by ethanol to obtain the colorless crystalline solid.

Yield: 71.4%

FIG. 4 is a view illustrating an NMR spectrum of a compound of Example 3.

FIG. 5 is a view illustrating an MS spectrum of the compound of Example 3.

Example 3. Synthesis of monomer—3' (synthesis of 2,6-bis(trimethyltin)-4,8-bis(5-(2-hexyl)thiophene-2-yl)benzo[1,2-b:4,5-b']dithiophene)

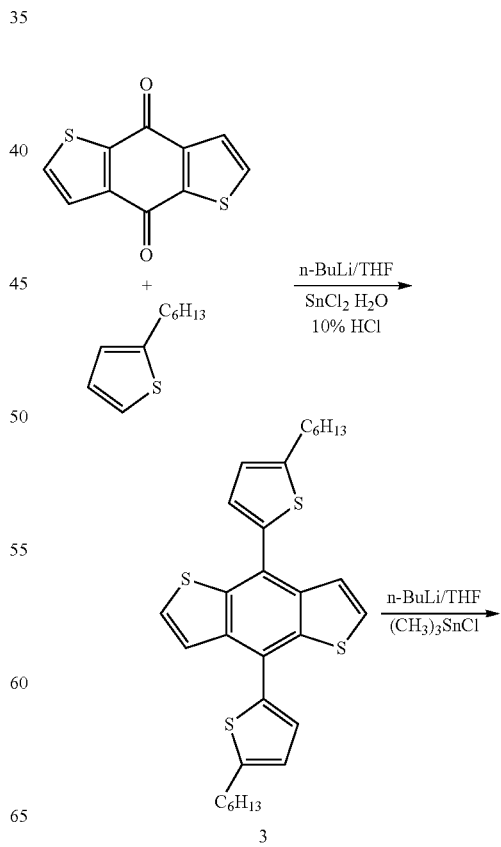

-continued

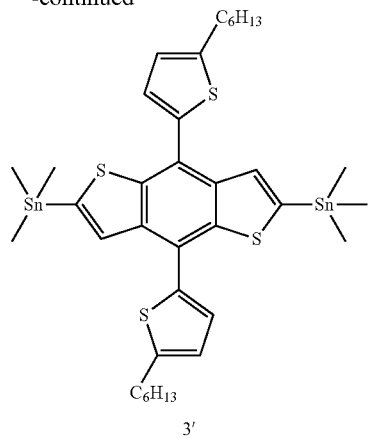

3'

3. 2-hexylthiophene (10.0 g, 59.4 mmol) was added into 500 ml of tetrahydrofuran (THF) and dissolved, and the temperature was then reduced to −78° C. 2.5M n-BuLi (2.5M n-butyllithium in hexane, 24.0 ml, 59.4 mmol) dissolved in hexane at this temperature was slowly added, and agitated for 30 minutes. Thereafter, the temperature was increased to 0° C., agitation was performed for 1 hour in this state, and 4,8-dihydrobenzo[1,2-b:4,5-b']dithiophene-4,8-dione (3.3 g, 14.8 mmol) was added into the solution at once, and agitated at 50° C. for 3 hours. After the temperature of the solution was reduced to room temperature, tin(II) chloride dihydrate ($SnCl_2.2H_2O$) (26 g) and 10% HCl (56 ml) were added, and further agitated for 3 hours. The solution was poured on ice, extracted by diethyl ether two times, and washed by water two times, and the residual material was removed by magnesium sulfate ($MgSO_4$). The solvent was removed from the residual solution under reduced pressure, and the yellow liquid having the high density was obtained through the silica column (eluent; petroleum).

Yield: 64%

3'. 3 (3.9 g, 7.59 mmol) was added into 100 ml of tetrahydrofuran (THF) and dissolved, and the temperature was then reduced to 0° C. 1.6M n-BuLi (1.6M n-butyllithium in hexane, 10.4 ml, 16.7 mmol) dissolved in hexane at this temperature was slowly added, and agitated at room temperature for 1 minutes. 1M trimethyltin chloride (1M trimethyltin chloride in THF, 22.7 ml, 22.7 mmol) dissolved in THF was added into the solution at once, and agitated for 2 hours. The solution was poured on water, extracted by diethyl ether two times, and washed by water two times, and the residual material was removed by magnesium sulfate ($MgSO_4$). The solvent was removed from the residual solution under reduced pressure, and recrystallization was performed by ethanol to obtain the light yellow crystalline solid.

Yield: 87%

FIG. 6 illustrates an NMR spectrum of a compound of Example 3.

FIG. 7 illustrates an MS spectrum of the compound of Example 3.

Example 4. Synthesis of monomer (synthesis of 2,6-bis(trimethyltin)-4,8-bis(5-(2-ethylhexyl)thiophene-2-yl)benzo[1,2-b:4,5-b']dithiophene)—4

[Monomer 4]

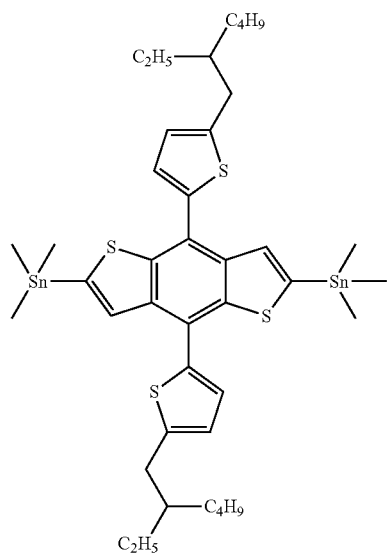

Monomer 4 was prepared by a method described in Kim, Ji-Hoon; Kim, Hee Un; Hwang, Do-Hoon; Kang, In-Nam; Lee, Sang Kyu; Moon, SangOJin; Shin, Won Suk., Macromolecules, 2012, 45, 8628-8638.

Example 5. Polymerization of Polymer (Polymerization of Copolymer 1)

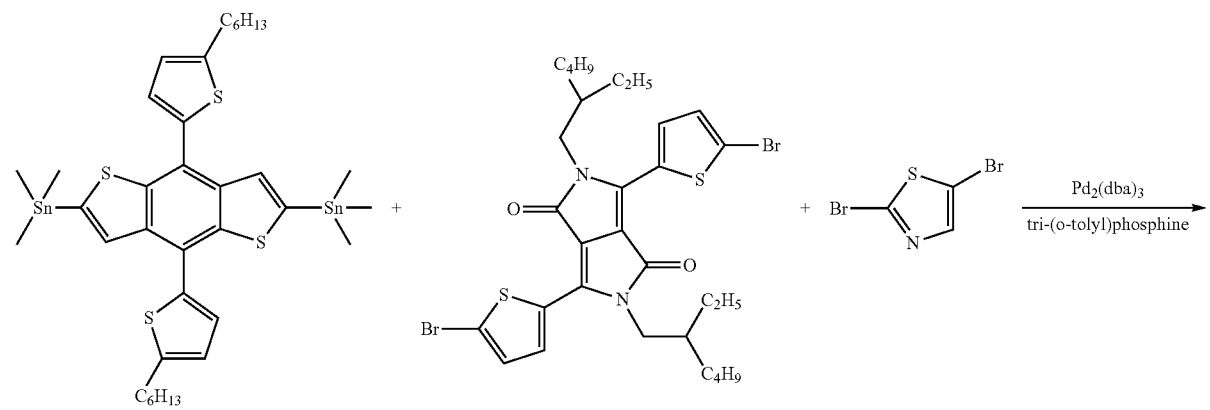

-continued

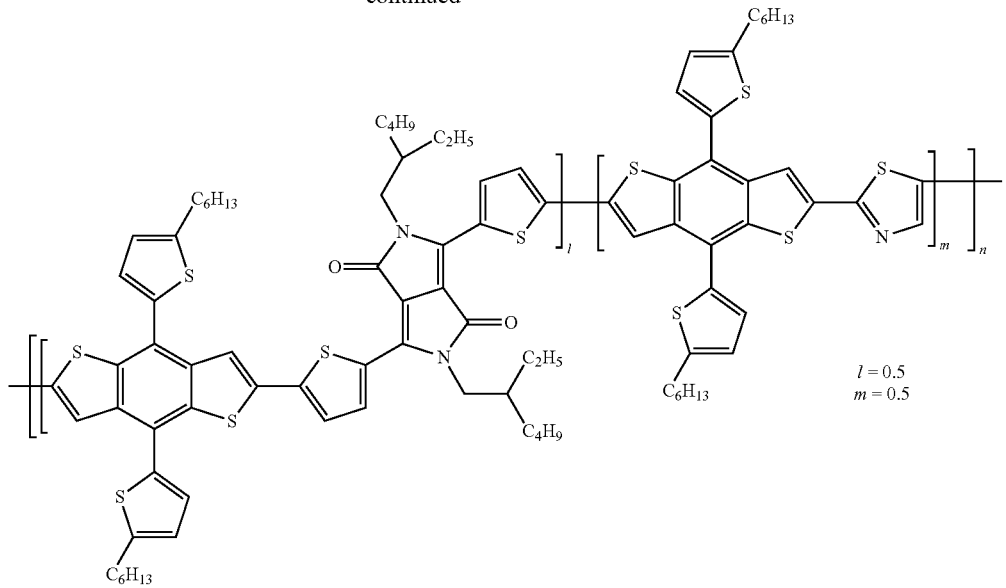

$l = 0.5$
$m = 0.5$

In the present specification, 2,5-dibormothiazole was used by performing re-column of a material of Aldrich Corporation.

18 ml of chlorobenzene, 2,6-bis(trimethyltin)-4,8-bis(5-(2-hexyl)thiophene-2-yl)benzo[1,2-b:4,5-b']dithiophene (0.700 g, 0.8250 mmol), 3,6-bis(5-bromo-2-thienyl)-2,5-bis(2-ethylhexyl)-2,5-dihydropyrrolo[3,4-c]pyrrole-1,4-dione (0.2815 g, 0.4125 mmol), 2,5-dibromothiazole (0.1002 g, 0.4125 mmol), $Pd_2(dba)_3$ (tris(dibenzylideneacetone)dipalladium(0), 10 mg), and tri-(o-tolyl)phosphine (18 mg) were added into the microwave reactor vial, and reacted under the condition of 170° C. for 1 hour. After the mixture was cooled to room temperature and poured on methanol, the solid was filtered to be subjected to Soxhlet extraction in acetone, hexane, methylene chloride, and chloroform, and the chloroform portion was precipitated again in methanol to filter the solid.

Yield: 39%

Number average molecular weight: 78,300 g/mol

Weight average molecular weight: 104,100 g/mol

FIG. 8 illustrates a film-type UV-Vis light absorption spectrum obtained by heat treatment of a chlorobenzene solution of copolymer 1 of Example 5.

The film-type UV light absorption spectrum of FIG. 8 was analyzed by using the UV-Vis light absorption spectrum (UV-Vis absorption spectrometer) after the sample obtained by dissolving the compound in chlorobenzene at a concentration of 1 wt %, dripping the solution on the glass substrate, and performing spin coating at 1000 rpm for 60 seconds was subjected to heat treatment at 25° C., 100° C., 130° C., 150° C., and 190° C.

FIG. 9 illustrates an electrochemical measurement result (cyclic voltammetry) of copolymer 1 of Example 5.

Electrochemical (cyclic voltammetry) measurement of FIG. 9 was analyzed by addedting the glassy carbon working electrode, the Ag/Agcl reference electrode, and the Pt electrode into the electrolytic solution where $Bu_4NBF_4$ was dissolved at a concentration of 0.1 M in acetonitrile, and using the three electrode method. The compound was applied on the working electrode by the drop casting method.

Example 6. Polymerization of Polymer (Polymerization of Copolymer 2)

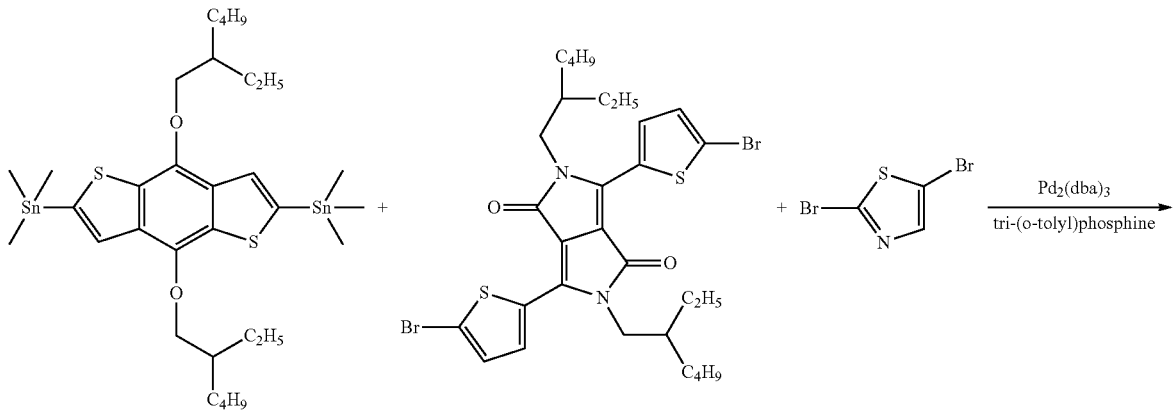

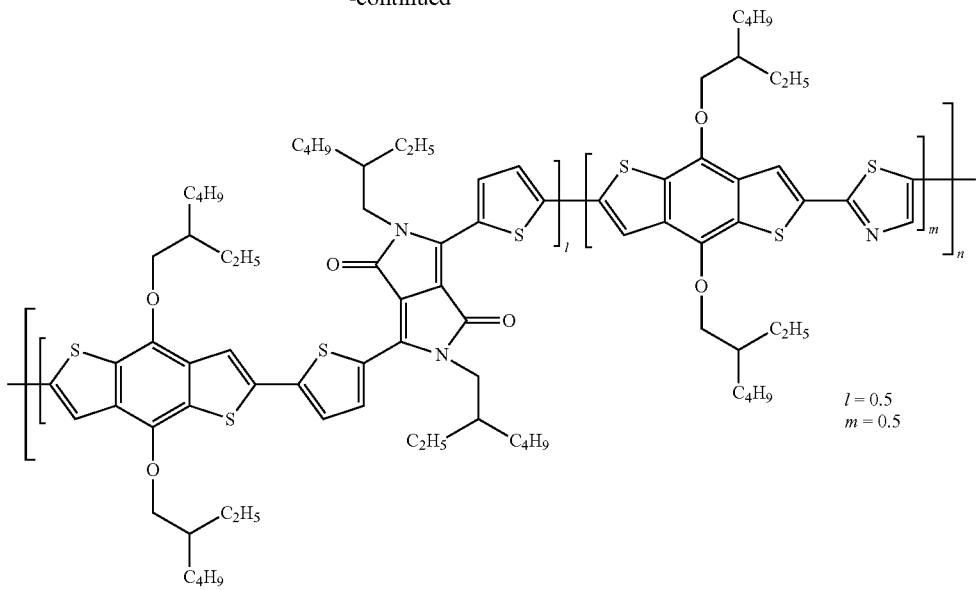

16 ml of chlorobenzene, 2,6-bis(trimethyltin)-4,8-di(2-ethylhexyloxy)benzo[1,2-b:4,5-b']dithiophene (0.500 g, 0.6474 mmol), 3,6-bis(5-bromo-2-thienyl)-2,5-bis(2-ethylhexyl)-2,5-dihydropyrrolo[3,4-c]pyrrole-1,4-dione (0.2209 g, 0.3237 mmol), 2,5-dibromothiazole (0.0786 g, 0.3237 mmol), $Pd_2(dba)_3$ (tris(dibenzylideneacetone)dipalladium (0), 15 mg), and tri-(o-tolyl)phosphine (23 mg) were added into the microwave reactor vial, and reacted under the condition of 170° C. for 1 hour. After the mixture was cooled to room temperature and poured on methanol, the solid was filtered to be subjected to Soxhlet extraction in acetone, hexane, methylene chloride, and chloroform, and the chloroform portion was precipitated again in methanol to filter the solid.

Yield: 52%

Number average molecular weight: 94,382 g/mol

Weight average molecular weight: 125,071 g/mol

FIG. 10 illustrates a film-type UV-Vis light absorption spectrum subjected to heat treatment by a chlorobenzene solution of copolymer 2 of Example 6.

The film-type UV light absorption spectrum of FIG. 10 was analyzed by using the UV-Vis light absorption spectrum (UV-Vis absorption spectrometer) after the sample obtained by dissolving the compound in chlorobenzene at a concentration of 1 wt %, dripping the solution on the glass substrate, and performing spin coating at 1000 rpm for 60 seconds was subjected to heat treatment at 25° C., 100° C., 130° C., 150° C., and 190° C.

FIG. 11 illustrates an electrochemical measurement result (cyclic voltammetry) of copolymer 2 of Example 6.

Electrochemical (cyclic voltammetry) measurement of FIG. 11 was analyzed by addedting the glassy carbon working electrode, the Ag/Agcl reference electrode, and the Pt electrode into the electrolytic solution where $Bu_4NBF_4$ was dissolved at a concentration of 0.1 M in acetonitrile, and using the three electrode method. The compound was applied on the working electrode by the drop casting method.

Example 7. Polymerization of Polymer
(Polymerization of Copolymer 3)

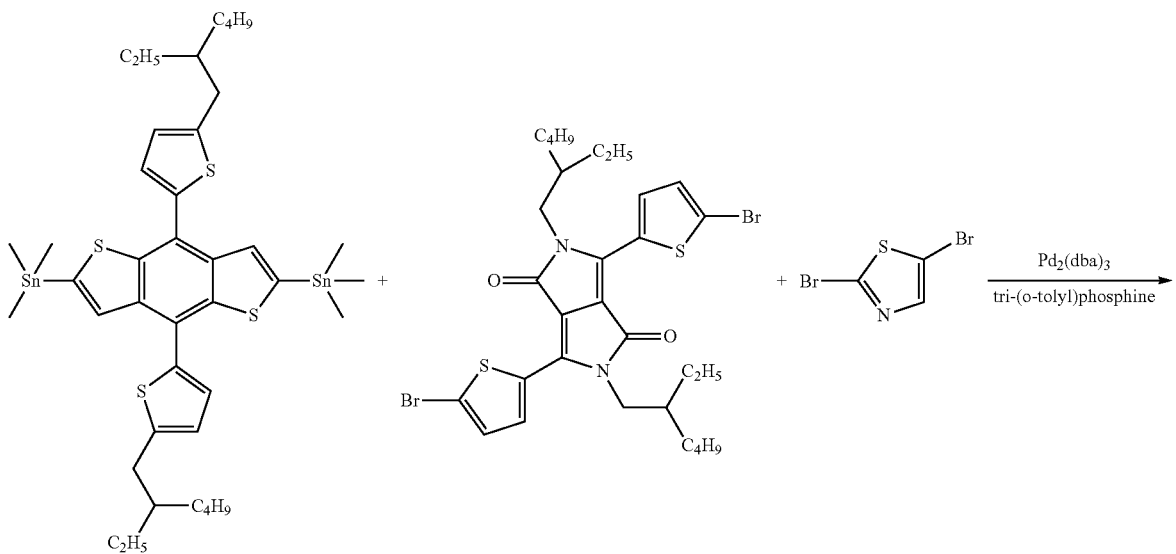

-continued

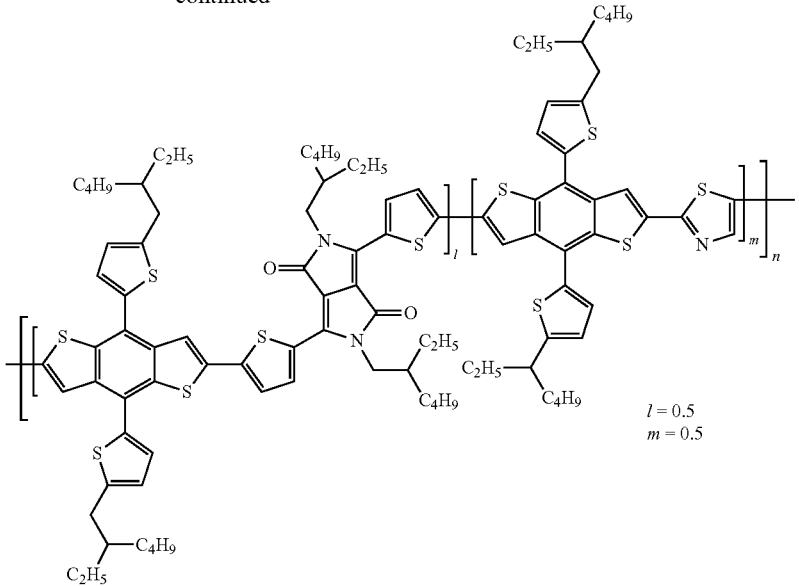

$l = 0.5$
$m = 0.5$ 18 ml of chlorobenzene, 2,6-bis(trimethyltin)-4,8-bis(5-(2-ethylhexyl)thiophene-2-yl)benzo[1,2-b:4,5-b']dithiophene (0.700 g, 0.7739 mmol), 3,6-bis(5-bromo-2-thienyl)-2,5-bis(2-ethylhexyl)-2,5-dihydropyrrolo[3,4-c]pyrrole-1,4-dione (0.2641 g, 0.3869 mmol), 2,5-dibromothiazole (0.0939 g, 0.3869 mmol), $Pd_2(dba)_3$ (tris(dibenzylideneacetone)dipalladium(0), 10 mg), and tri-(o-tolyl)phosphine (28 mg)) were added into the microwave reactor vial, and reacted under the condition of 170° C. for 1 hour. After the mixture was cooled to room temperature and poured on methanol, the solid was filtered to be subjected to Soxhlet extraction in acetone, hexane, methylene chloride, and chloroform, and the chloroform portion was precipitated again in methanol to filter the solid.

Yield: 42%
Number average molecular weight: 47,911 g/mol
Weight average molecular weight: 75,264 g/mol FIG. 12 illustrates a film-type UV-Vis light absorption spectrum subjected to heat treatment by a chlorobenzene solution of copolymer 3 of Example 7.

The film-type UV light absorption spectrum of FIG. 12 was analyzed by using the UV-Vis light absorption spectrum (UV-Vis absorption spectrometer) after the sample obtained by dissolving the compound in chlorobenzene at a concentration of 1 wt %, dripping the solution on the glass substrate, and performing spin coating at 1000 rpm for 60 seconds was subjected to heat treatment at 25° C. and 120° C.

FIG. 13 illustrates an electrochemical measurement result (cyclic voltammetry) of copolymer 3 of Example 7.

Electrochemical (cyclic voltammetry) measurement of FIG. 13 was analyzed by addedting the glassy carbon working electrode, the Ag/Agcl reference electrode, and the Pt electrode into the electrolytic solution where $Bu_4NBF_4$ was dissolved at a concentration of 0.1 M in acetonitrile, and using the three electrode method. The compound was applied on the working electrode by the drop casting method.

Example 8. Polymerization of Polymer
(Polymerization of Copolymer 4)

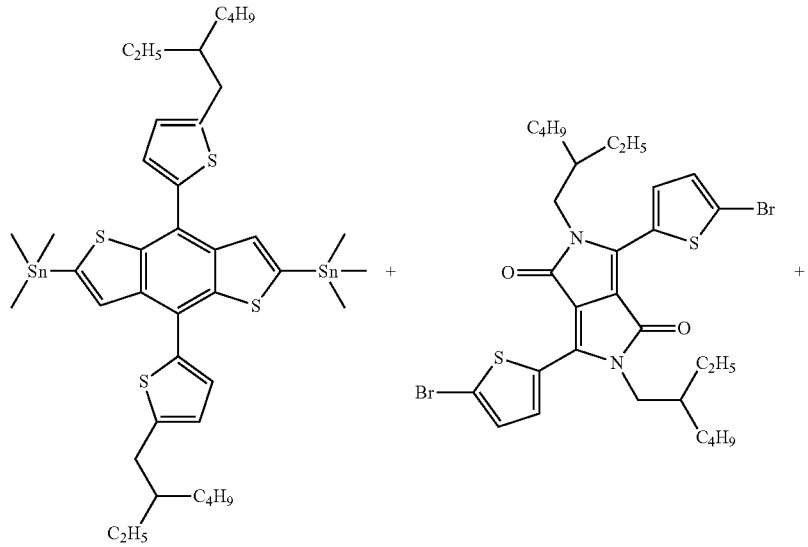

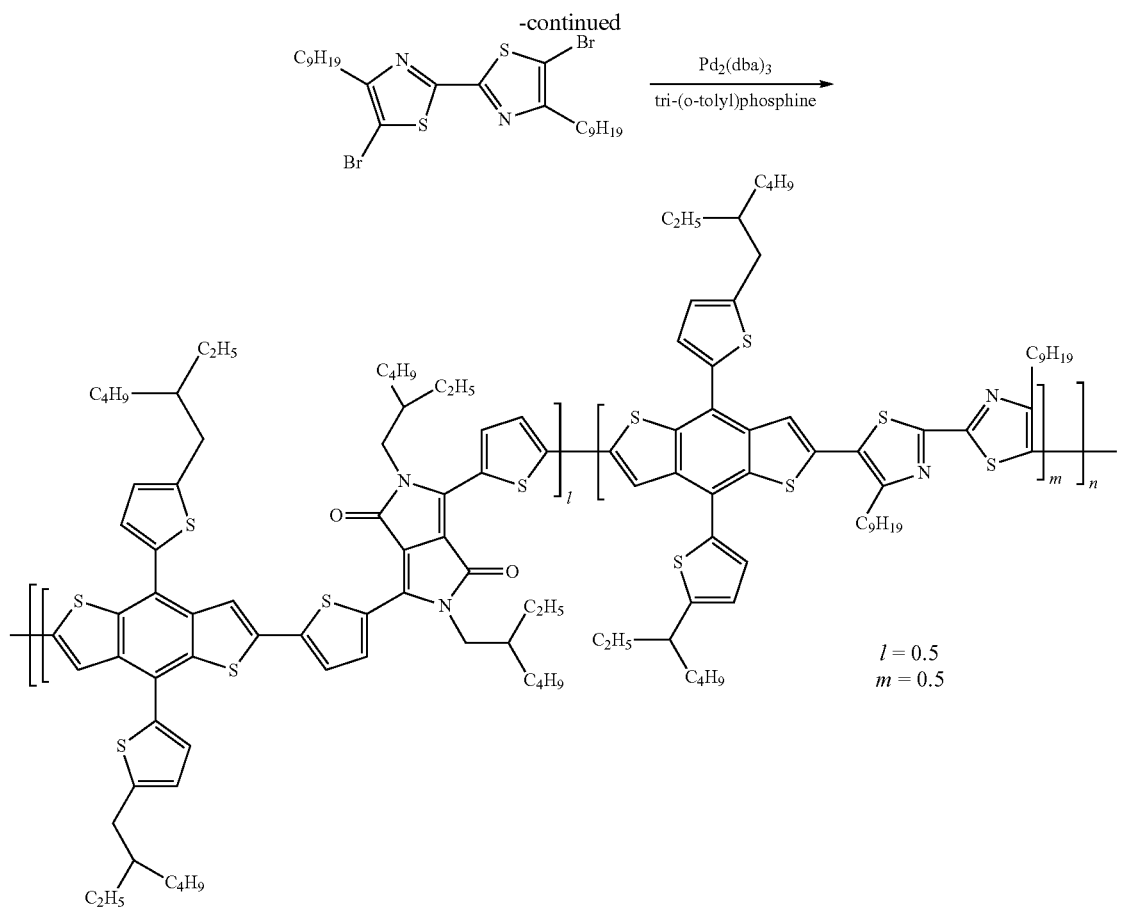

18 ml of chlorobenzene, 2,6-bis(trimethyltin)-4,8-bis(5-(2-ethylhexyl)thiophene-2-yl)benzo[1,2-b:4,5-b']dithiophene (0.700 g, 0.7739 mmol), 3,6-bis(5-bromo-2-thienyl)-2,5-bis(2-ethylhexyl)-2,5-dihydropyrrolo[3,4-c]pyrrole-1,4-dione (0.2641 g, 0.3869 mmol), 5,5'-dibromo-4,4'-dinonyl-2,2'-bithiazole (0.2238 g, 0.3869 mmol), Pd$_2$(dba)$_3$ (tris(dibenzylideneacetone)dipalladium(0), 10 mg), and tri-(o-tolyl)phosphine (28 mg) were added into the microwave reactor vial, and reacted under the condition of 170° C. for 1 hour. After the mixture was cooled to room temperature and poured on methanol, the solid was filtered to be subjected to Soxhlet extraction in acetone, hexane, methylene chloride, and chloroform, and the chloroform portion was precipitated again in methanol to filter the solid.

Yield: 40%
Number average molecular weight: 93,773 g/mol
Weight average molecular weight: 127,530 g/mol FIG. 14 illustrates a subjected to heat treatment by a chlorobenzene solution of copolymer 4 of Example 8.

The film-type UV light absorption spectrum of FIG. 14 was analyzed by using the UV-Vis light absorption spectrum (UV-Vis absorption spectrometer) after the sample obtained by dissolving the compound in chlorobenzene at a concentration of 1 wt %, dripping the solution on the glass substrate, and performing spin coating at 1000 rpm for 60 seconds was subjected to heat treatment at 25° C. and 120° C.

FIG. 15 illustrates an electrochemical measurement result (cyclic voltammetry) of copolymer 4 of Example 8.

Electrochemical (cyclic voltammetry) measurement of FIG. 15 was analyzed by addedting the glassy carbon working electrode, the Ag/Agcl reference electrode, and the Pt electrode into the electrolytic solution where Bu$_4$NBF$_4$ was dissolved at a concentration of 0.1 M in acetonitrile, and using the three electrode method. The compound was applied on the working electrode by the drop casting method.

Manufacturing and Measurement of Properties of Organic Solar Cell

Preparation Example 1. Manufacturing of Organic Solar Cell—1

Copolymer 1 prepared in Example 5 and PCBM were dissolved at a ratio of 1:2 in chlorobenzene (CB) to prepare the composite solution. In this case, the concentration was adjusted to 2.0 wt %, and the organic solar cell had the structure of ITO/PEDOT:PSS/photoactive layer/Al. The glass substrate on which ITO was applied was washed by the ultrasonic wave by using distilled water, acetone, or 2-propanol, the ITO surface was treated by ozone for 10 minutes, PEDOT:PSS (baytrom P) was subjected to spin coating in a thickness of 45 nm, and heat treatment was performed at 120° C. for 10 minutes. For coating of the photoactive layer, the compound-PCBM composite solution was filtered by the 0.45 μm PP syringe filter and then subjected to spin coating to deposit Al in a thickness of 200 nm by using the thermal evaporator under the vacuum of 3×10$^{-8}$ torr and thus manufacture the organic solar cell.

Preparation Example 2. Manufacturing of Organic Solar Cell—2

Copolymer 2 prepared in Example 6 and PCBM were dissolved at a ratio of 1:2 in chlorobenzene (CB) to prepare the composite solution. In this case, the concentration was adjusted to 2.0 wt %, and the organic solar cell had the structure of ITO/PEDOT:PSS/photoactive layer/Al. The glass substrate on which ITO was applied was washed by the ultrasonic wave by using distilled water, acetone, or 2-propanol, the ITO surface was treated by ozone for 10 minutes, PEDOT:PSS (baytrom P) was subjected to spin coating in a thickness of 45 nm, and heat treatment was performed at 120° C. for 10 minutes. For coating of the photoactive layer, the compound-PCBM composite solution was filtered by the 0.45 μm PP syringe filter and then subjected to spin coating, and Al was deposited in a thickness of 200 nm by using the thermal evaporator under the vacuum of $3 \times 10^{-8}$ torr to manufacture the organic solar cell.

Preparation Example 3. Manufacturing of Organic Solar Cell—3

Copolymer 3 prepared in Example 7 and PCBM were dissolved at a ratio of 1:2 in chlorobenzene (CB) to prepare the composite solution. In this case, the concentration was adjusted to 2.0 wt %, and the organic solar cell had the structure of ITO/PEDOT:PSS/photoactive layer/Al. The glass substrate on which ITO was applied was washed by the ultrasonic wave by using distilled water, acetone, or 2-propanol, the ITO surface was treated by ozone for 10 minutes, PEDOT:PSS (baytrom P) was subjected to spin coating in a thickness of 45 nm, and heat treatment was performed at 120° C. for 10 minutes. For coating of the photoactive layer, the compound-PCBM composite solution was filtered by the 0.45 μm PP syringe filter and then subjected to spin coating to deposit Al in a thickness of 200 nm by using the thermal evaporator under the vacuum of $3 \times 10^{-8}$ torr and thus manufacture the organic solar cell.

Preparation Example 4. Manufacturing of Organic Solar Cell—4

Copolymer 4 prepared in Example 8 and PCBM were dissolved at a ratio of 1:2 in chlorobenzene (CB) to prepare the composite solution. In this case, the concentration was adjusted to 2.0 wt %, and the organic solar cell had the structure of ITO/PEDOT:PSS/photoactive layer/Al. The glass substrate on which ITO was applied was washed by the ultrasonic wave by using distilled water, acetone, or 2-propanol, the ITO surface was treated by ozone for 10 minutes, PEDOT:PSS (baytrom P) was subjected to spin coating in a thickness of 45 nm, and heat treatment was performed at 120° C. for 10 minutes. For coating of the photoactive layer, the compound-PCBM composite solution was filtered by the 0.45 μm PP syringe filter and then subjected to spin coating, and Al was deposited in a thickness of 200 nm by using the thermal evaporator under the vacuum of $3 \times 10^{-8}$ torr to manufacture the organic solar cell.

Comparative Example 1. Manufacturing of Organic Solar Cell

P3HT and PCBM were dissolved at a ratio of 1:1 in 1,2-dichlorobenzene (DCB) to prepare the composite solution. In this case, the concentration was adjusted to 1.0 to 2.0 wt %, and the organic solar cell had the structure of ITO/PEDOT:PSS/photoactive layer/LiF/Al. The glass substrate on which ITO was applied was washed by the ultrasonic wave by using distilled water, acetone, or 2-propanol, the ITO surface was treated by ozone for 10 minutes, PEDOT:PSS (baytrom P) was subjected to spin coating in a thickness of 45 cm, and heat treatment was performed at 120° C. for 10 minutes. For coating of the photoactive layer, the compound-PCBM composite solution was filtered by the 0.45 μm PP syringe filter and then subjected to spin coating, heat treatment was performed at 120° C. for 5 minutes, and LiF was deposited in a thickness of 7 Å and Al was then deposited in a thickness of 200 nm by using the thermal evaporator under the vacuum of $3 \times 10$ torr to manufacture the organic solar cell.

Experimental Example 1

The photoelectric conversion characteristics of the organic solar cell manufactured in Preparation Examples 1 to 4 and Comparative Example 1 were measured under the condition of 100 mW/cm$^2$ (AM 1.5), and the results are described in the following Table 1.

TABLE 1

| Active layer | | $V_{OC}$ (V) | $J_{SC}$ (mA/cm$^2$) | FF | PCE (%) |
|---|---|---|---|---|---|
| Preparation Example 1 | Copolymer 1/PC$_{61}$BM = 1:2 | 0.84 | 11.93 | 70.2 | 7.02 |
| Preparation Example 2 | Copolymer 2/PC$_{61}$BM = 1:2 | 0.72 | 11.48 | 56.6 | 4.64 |
| Preparation Example 3 | Copolymer 3/PC$_{61}$BM = 1:2 | 0.82 | 15.51 | 64.7 | 8.18 |
| Preparation Example 4 | Copolymer 4/PC$_{61}$BM = 1:2 | 0.82 | 12.20 | 59.2 | 5.93 |
| Comparative Example 1 | P3HT/PC$_{61}$BM = 1:1 | 0.64 | 7.89 | 58.4 | 2.98 |

In Table 1, $V_{oc}$ means an open circuit voltage, $J_{sc}$ means a short-circuit current, FF means a fill factor, and PCE means energy conversion efficiency. The open circuit voltage and the short-circuit current are each intercepts of X and Y axes in fourth quadrants of a voltage-current density curve, and as these two values are increased, efficiency of the solar cell is preferably increased. Further, the fill factor is a value obtained by dividing an area of a rectangle that may be drawn in the curve by the product of the short-circuit and the open circuit voltage. If these three values are divided by the intensity of radiated light, energy conversion efficiency may be obtained, and the higher the value is, the better the efficiency is.

FIG. 16 illustrates a current density according to a voltage of a solar cell of an organic solar cell device using copolymer 1 prepared according to Example 5.

FIG. 17 illustrates a current density according to a voltage of a solar cell of an organic solar cell device using copolymer 2 prepared according to Example 6.

FIG. 18 illustrates a current density according to a voltage of a solar cell of an organic solar cell device using copolymer 3 prepared according to Example 7.

FIG. 19 illustrates a current density according to a voltage of a solar cell of an organic solar cell device using copolymer 4 prepared according to Example 8.

The invention claimed is:
1. A copolymer comprising:
a unit represented by the following Chemical Formula 1 or 2:

[Chemical Formula 1]

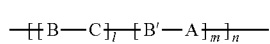

[Chemical Formula 2]

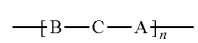

in Chemical Formulas 1 and 2, l is a mol fraction and a real number of more than 0 and less than 1, m is a mol fraction and a real number of more than 0 and less than 1, a sum of l and m is 1, n is an integer of 1 to 10,000, B and B' are the same as or different from each other, and are each independently unit B including a substituted or unsubstituted monocyclic or polycyclic hetero-cyclic group, C is unit C including a substituted or unsubstituted monocyclic or polycyclic aryl group or a substituted or unsubstituted monocyclic or polycyclic hetero-cyclic group, and at least one of unit B and unit C includes a substituted or unsubstituted polycyclic aryl group or a substituted or unsubstituted polycyclic hetero-cyclic group, wherein unit C includes one or two or more of the following Chemical Formulas:

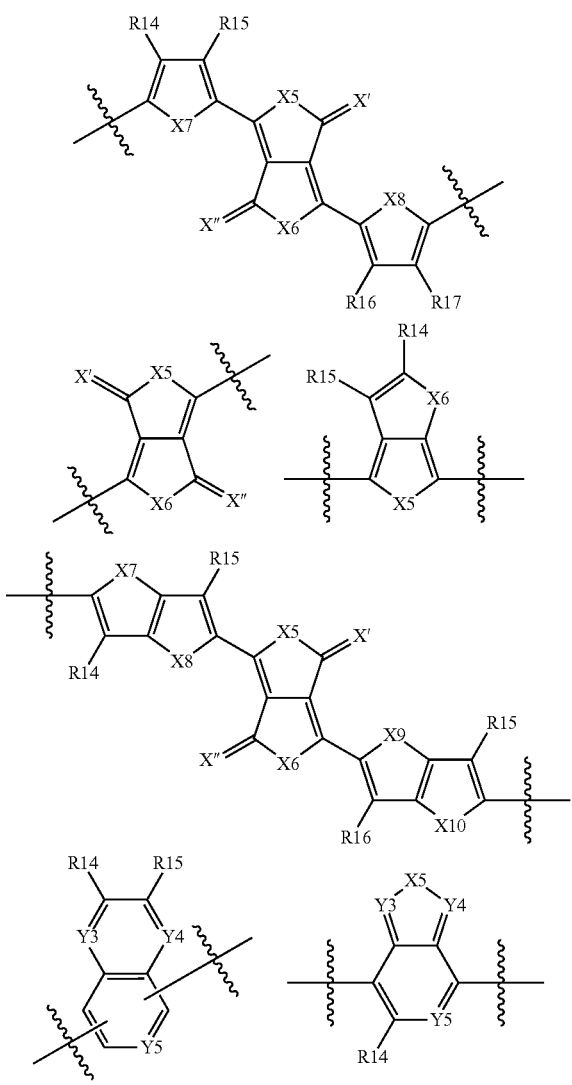

-continued

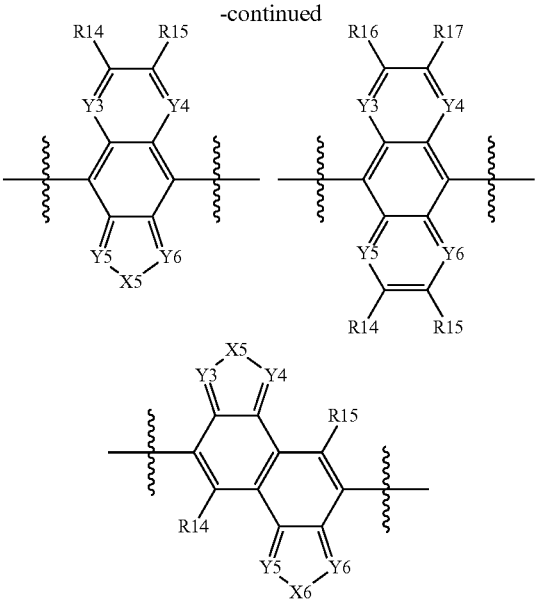

R14 to R17 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group, X' and X" are the same as or different from each other, and are each independently O or S, X5 to X10 are the same as or different from each other, and are each independently selected from the group consisting of CR18R19, NR18, O, SiR18R19, PR18, S, GeR18R19, Se, and Te, Y3 to Y6 are the same as or different from each other, and are each independently selected from the group consisting of CR18, N, SiR18, P, and GeR18, and R18 and R19 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group, A is unit A represented by the following Chemical Formulas 4 or 5,

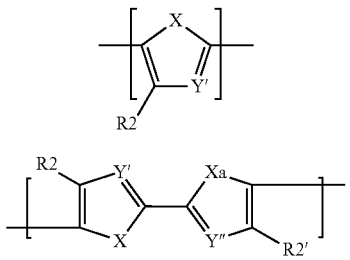

[Chemical Formula 4]

[Chemical Formula 5]

in Chemical Formulas 4 or 5,

X and Xa are the same as or different from each other, and are each independently selected from the group consisting of CRR', NR, O, SiRR', PR, S, GeRR', Se, and Te, Y' and Y" are the same as or different from each other, and are each independently selected from the group consisting of CR, N, SiR, P, and GeR, with a proviso that X is NR or Y' is N, with a proviso that Xa is NR or Y" is N, R1, R2, R2', R, and R' are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group.

2. The copolymer of claim 1, wherein unit B is an electron donor and unit C is an electron acceptor.

3. The copolymer of claim 1, wherein at least one of unit A, unit B, and unit C has a substituted or unsubstituted branch-chained alkoxy group or a substituted or unsubstituted branch-chained alkyl group.

4. The copolymer of claim 1, wherein at least one of unit A, unit B, and unit C is substituted by one or two or more substituent groups selected from the group consisting of a substituted or unsubstituted branch-chained alkoxy group; a substituted or unsubstituted branch-chained alkyl group; and a substituent group substituted by a branch-chained alkoxy group or a branch-chained alkyl group.

5. The copolymer of claim 1, wherein unit B includes one or two or more of the following Chemical Formulas:

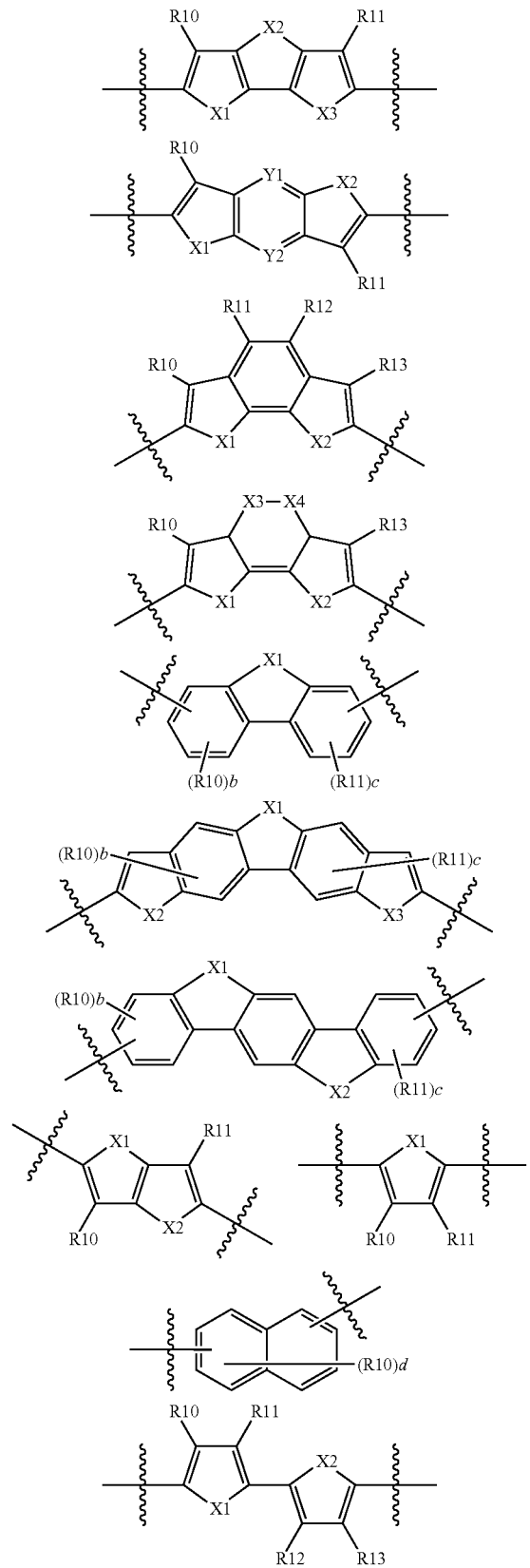

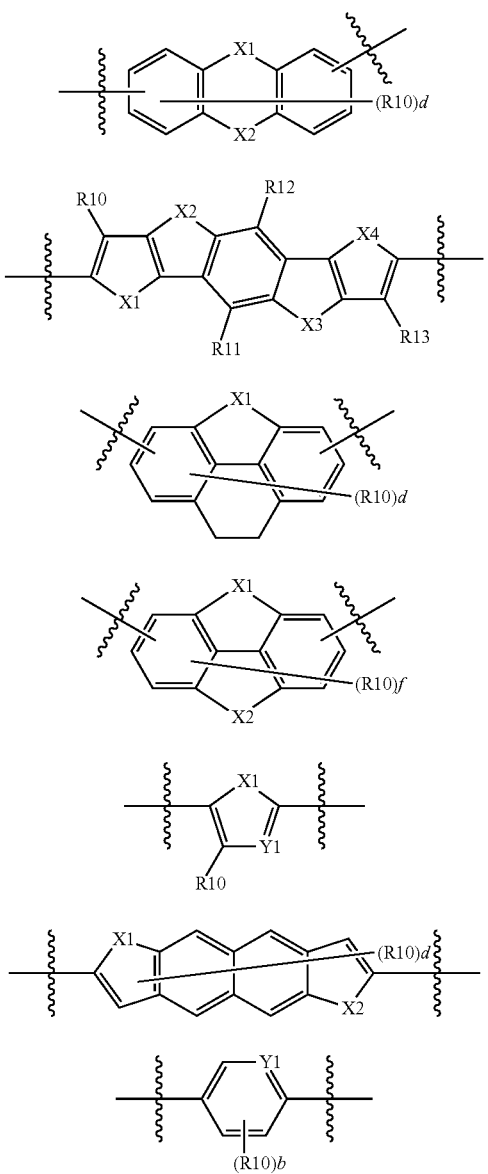

in the Chemical Formulas,
b and c are each an integer of 1 to 3,
d is an integer of 1 to 6,
f is an integer of 1 to 4,
R10 to R13 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group, X1 to X4 are the same as or different from each other, and are each independently selected from the group consisting of CR"R'", NW, O, SiR"R'", PR", S, GeR"R'", Se, and Te, Y1 and Y2 are the same as or different from each other, and are each independently selected from the group consisting of CR", N, SiR", P, and GeR", and R" and R'" are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group.

6. The copolymer of claim 1, wherein unit A is the following Chemical Formula 4-1 or 5-1:

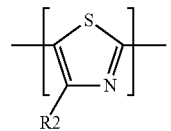

[Chemical Formula 4-1]

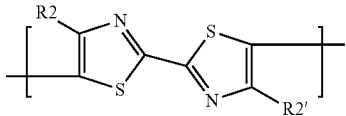

[Chemical Formula 5-1]

in Chemical Formulas 4-1 and 5-1,
R2 and R2' are the same as or different from each other, and are hydrogen; or a substituted or unsubstituted alkyl group.

7. The copolymer of claim 1, wherein the copolymer includes a unit represented by any one of the following Chemical Formulas 1-1 to 1-3:

[Chemical Formula 1-1]
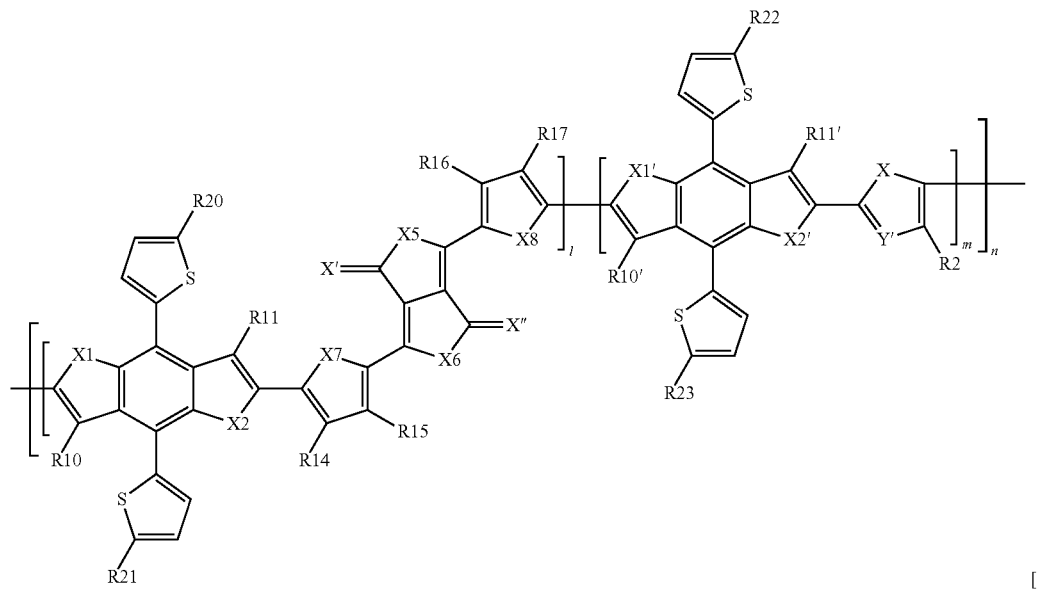
[Chemical Formula 1-2]
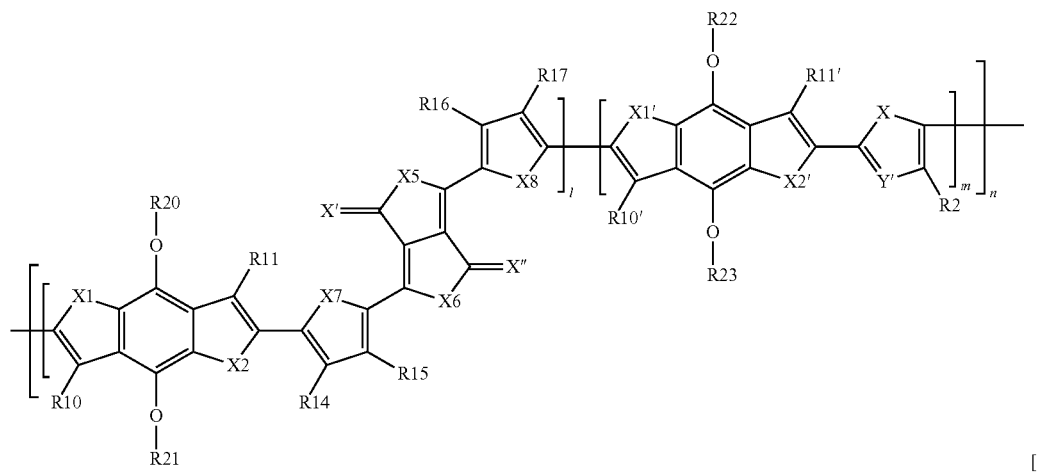
[Chemical Formula 1-3]
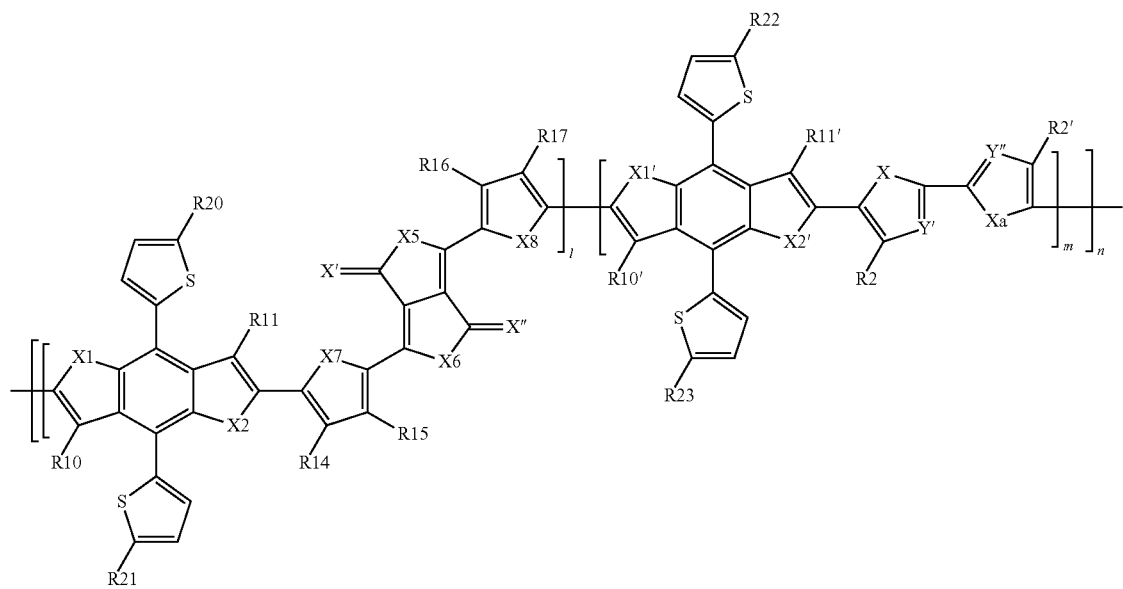

in Chemical Formulas 1-1 to 1-3,

X and Xa are the same as or different from each other, and are each independently selected from the group consisting of CRR', NR, O, SiRR', PR, S, GeRR', Se, and Te, Y' and Y" are the same as or different from each other, and are each independently selected from the group consisting of CR, N, SiR, P, and GeR, with a proviso that X is NR or Y' is N, with a proviso that Xa is NR or Y" is N, l is a mol fraction and a real number of more than 0 and less than 1, m is a mol fraction and a real number of more than 0 and less than 1, a sum of l and m is 1, n is an integer of 1 to 10,000, R2, R2', R10, R11, R10', R11', R14 to R17, and R20 to R23 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group, X' and X" are the same as or different from each other, and are each independently O or S, X1, X2, X1', and X2' are the same as or different from each other, and are each independently selected from the group consisting of CR"R''', NW, O, SiR"R''', PR", S, GeR"R''', Se, and Te, X5 to X8 are the same as or different from each other, and are each independently selected from the group consisting of CR18R19, NR18, 0, SiR18R19, PR18, S, GeR18R19", Se, and Te, and R", W''', R18, and R19 are the same as or different from each other, and are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted hetero-cyclic group.

8. The copolymer of claim 1, wherein a content of unit A is 0.01 mol % to 30 mol % based on a total content of the copolymer, a content of unit B is 50 mol % to 80 mol % based on the total content of the copolymer, and a content of unit C is 0.01 mol % to 30 mol % based on the total content of the copolymer.

9. The copolymer of claim 1, wherein a number average molecular weight of the copolymer is 500 g/mol to 1,000,000 g/mol.

10. The copolymer of claim 1, wherein a molecular weight distribution of the copolymer is 1 to 100.

11. An organic solar cell comprising:
a first electrode;
a second electrode provided to face the first electrode; and
one or more organic material layers provided between the first electrode and the second electrode and including a photoactive layer,
wherein one or more layers of the organic material layers include the copolymer according to claim 1.

12. The organic solar cell of claim 11, wherein the organic material layer includes a hole transport layer, a hole injection layer, or a layer simultaneously transporting and injecting holes, and the hole transport layer, the hole injection layer, or the layer simultaneously transporting and injecting the holes includes the copolymer.

13. The organic solar cell of claim 11, wherein the organic material layer includes an electron injection layer, an electron transport layer, or a layer simultaneously injecting and transporting electrons, and the electron injection layer, the electron transport layer, or the layer simultaneously injecting and transporting the electrons includes the copolymer.

14. The organic solar cell of claim 11, wherein the photoactive layer includes one or two or more selected from the group consisting of an electron donor and an electron acceptor, and the electron donor includes the copolymer.

15. The organic solar cell of claim 14, wherein the electron acceptor is selected from the group consisting of fullerene, a fullerene derivative, a carbon nanotube, a carbon nanotube derivative, bathocuproin, a semiconducting element, a semiconducting compound, and a combination thereof.

16. The organic solar cell of claim 14, wherein the electron donor and the electron acceptor constitute a bulk hetero junction (BHJ).

17. The organic solar cell of claim 11, wherein the photoactive layer has a bilayered thin film structure including an n-type organic material layer and a p-type organic material layer, and the p-type organic material layer includes the copolymer.

* * * * *